(12) United States Patent
Tang et al.

(10) Patent No.: US 10,461,149 B1
(45) Date of Patent: Oct. 29, 2019

(54) ELEVATIONALLY-ELONGATED CONDUCTIVE STRUCTURE OF INTEGRATED CIRCUITRY, METHOD OF FORMING AN ARRAY OF CAPACITORS, METHOD OF FORMING DRAM CIRCUITRY, AND METHOD OF FORMING AN ELEVATIONALLY-ELONGATED CONDUCTIVE STRUCTURE OF INTEGRATED CIRCUITRY

(71) Applicant: Micron Technology, Inc., Boise, ID (US)

(72) Inventors: Sanh D. Tang, Kuna, ID (US); Kuo-Chen Wang, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/021,683

(22) Filed: Jun. 28, 2018

(51) Int. Cl.
    *H01L 49/02*     (2006.01)
    *H01L 21/3213*     (2006.01)
    *H01L 27/108*     (2006.01)

(52) U.S. Cl.
    CPC ........ *H01L 28/92* (2013.01); *H01L 21/32135* (2013.01); *H01L 27/10852* (2013.01); *H01L 27/10888* (2013.01)

(58) Field of Classification Search
    CPC ....................................................... H01L 28/92
    See application file for complete search history.

(56) References Cited

U.S. PATENT DOCUMENTS

| 2006/0012052 A1* | 1/2006 | McDevitt .......... H01L 21/76802 257/778 |
| 2007/0290248 A1* | 12/2007 | Weis ................... H01L 27/0207 257/301 |
| 2012/0135579 A1* | 5/2012 | Park ................... H01L 27/0207 438/381 |
| 2015/0364414 A1 | 12/2015 | Tang et al. |

OTHER PUBLICATIONS

U.S. Appl. No. 16/021,709, filed Jun. 28, 2018, by Wang et al.

* cited by examiner

*Primary Examiner* — Xia L Cross
(74) *Attorney, Agent, or Firm* — Wells St. John P.S.

(57) ABSTRACT

A method of forming elevationally-elongated conductive structures of integrated circuitry comprises providing a substrate comprising a plurality of spaced elevationally-extending conductive vias. Conductive material is formed directly above and directly against the conductive vias. The conductive material has an upper surface and a first sidewall that are directly above individual of the conductive vias in a vertical cross-section. The conductive material has a second sidewall that is not directly above the individual conductive vias. Covering material is formed directly above individual of the upper surfaces and against individual of the first sidewalls directly above the individual conductive vias. The covering material comprises a composition different from that of at least some of the conductive material. Etching is conducted completely through at least some of the covering material that is directly above the individual upper surfaces to the conductive material directly there-below and etching is conducted into said conductive material. The covering material that is against the individual first sidewalls masks the individual first sidewalls from being etched during said etchings. Structure that may be independent of method is disclosed.

24 Claims, 27 Drawing Sheets

ELEVATIONALLY-ELONGATED CONDUCTIVE STRUCTURE OF INTEGRATED CIRCUITRY, METHOD OF FORMING AN ARRAY OF CAPACITORS, METHOD OF FORMING DRAM CIRCUITRY, AND METHOD OF FORMING AN ELEVATIONALLY-ELONGATED CONDUCTIVE STRUCTURE OF INTEGRATED CIRCUITRY

TECHNICAL FIELD

Embodiments disclosed herein pertain to elevationally-elongated conductive structures of integrated circuitry, to methods of forming an array of capacitors, to methods of forming DRAM circuitry, and to methods of forming an elevationally-elongated conductive structure of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

In some memory and other circuitry, a capacitor connects to a source/drain region of a field effect transistor there-below through an elevationally-elongated conductive structure such as a conductive via.

DETAILED DESCRIPTION OF EXAMPLE EMBODIMENTS

Figure 1:
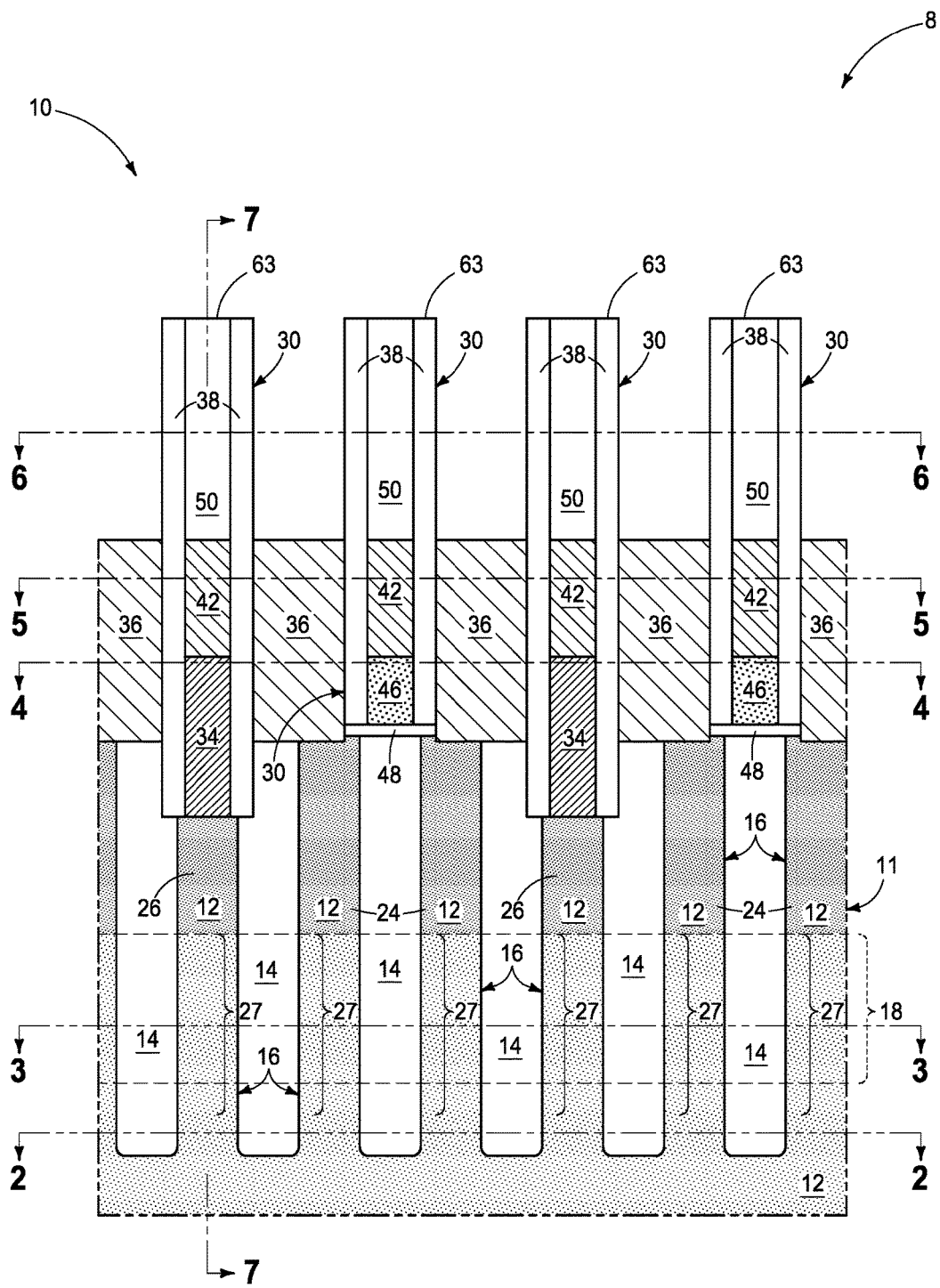
FIG. 1 is a diagrammatic cross-sectional view of a portion of a DRAM construction in process in accordance with some embodiments of the invention and is taken through line 1-1 in FIGS. 1-9.
Figure 2:
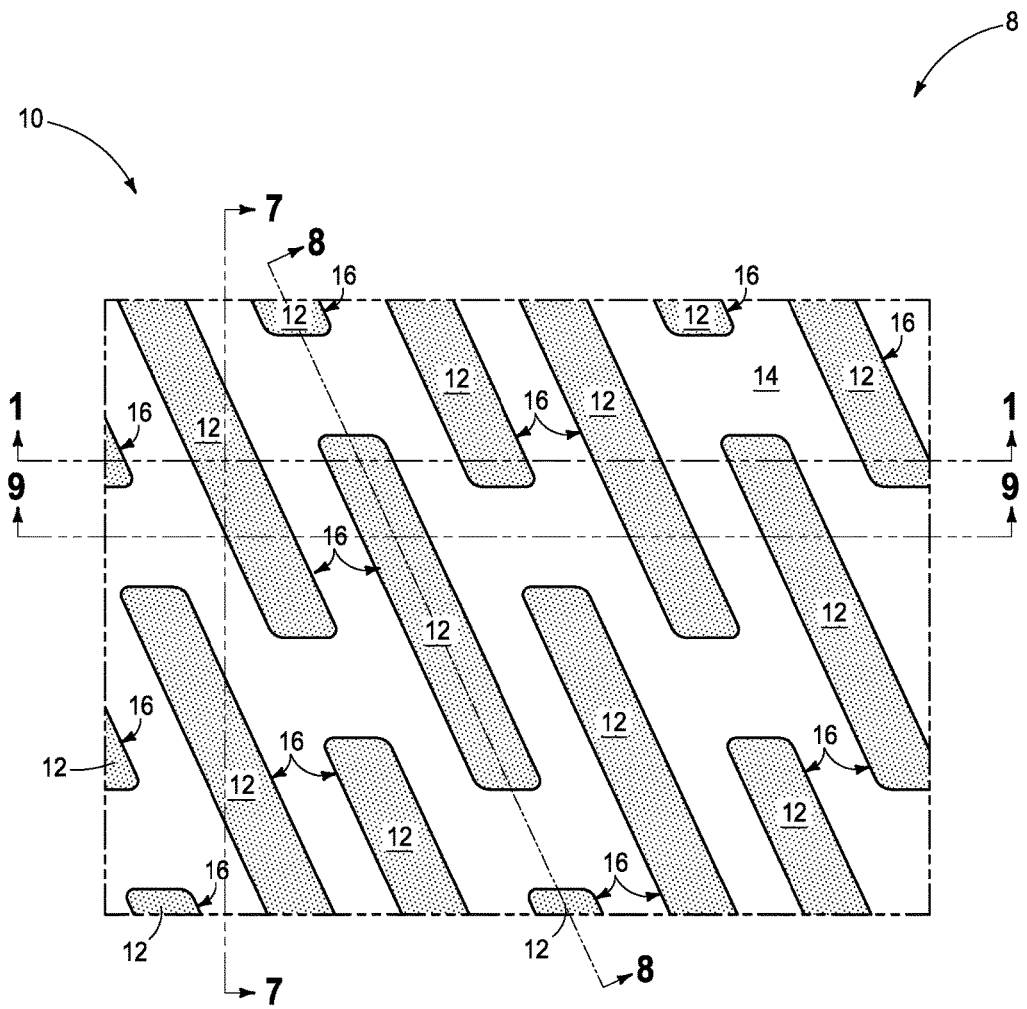
FIG. 2 is a view taken through line 2-2 in FIGS. 1 and 7-9.
Figure 3:
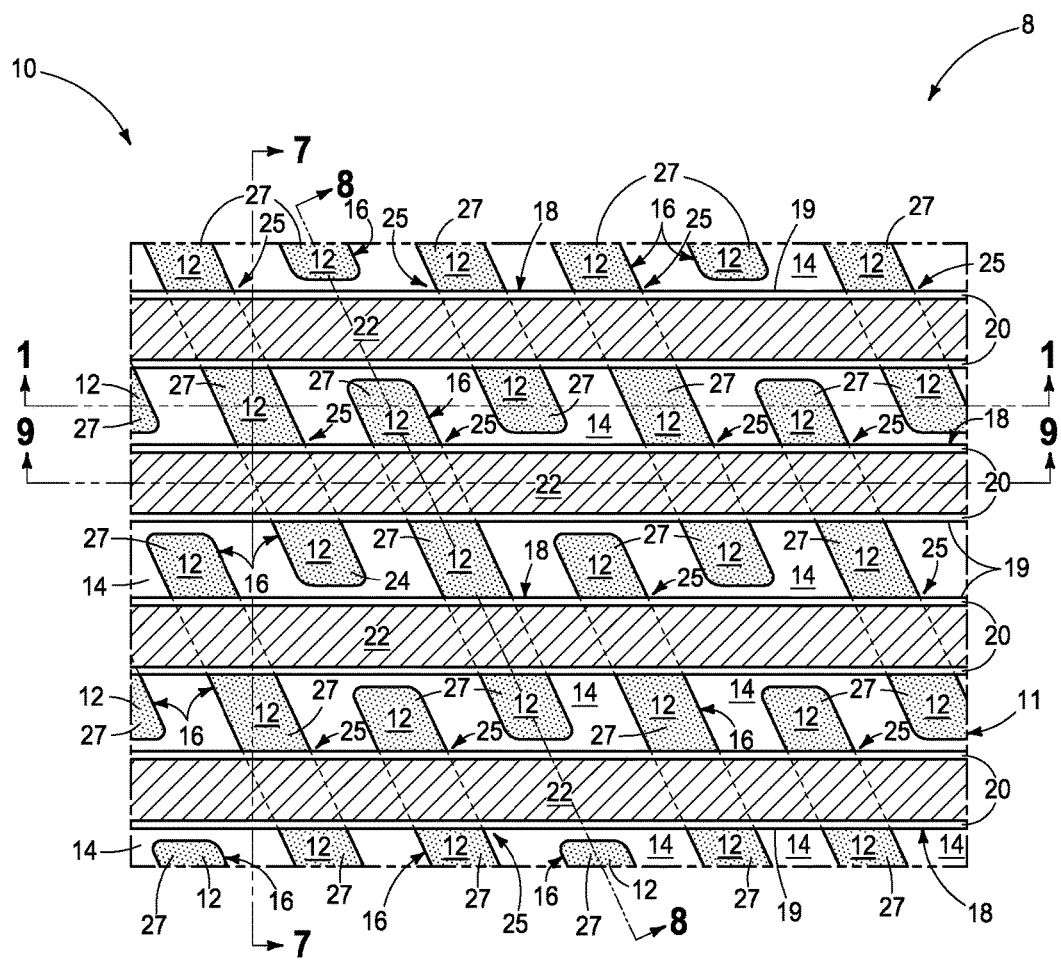
FIG. 3 is a view taken through line 3-3 in FIGS. 1 and 7-9.
Figure 4:
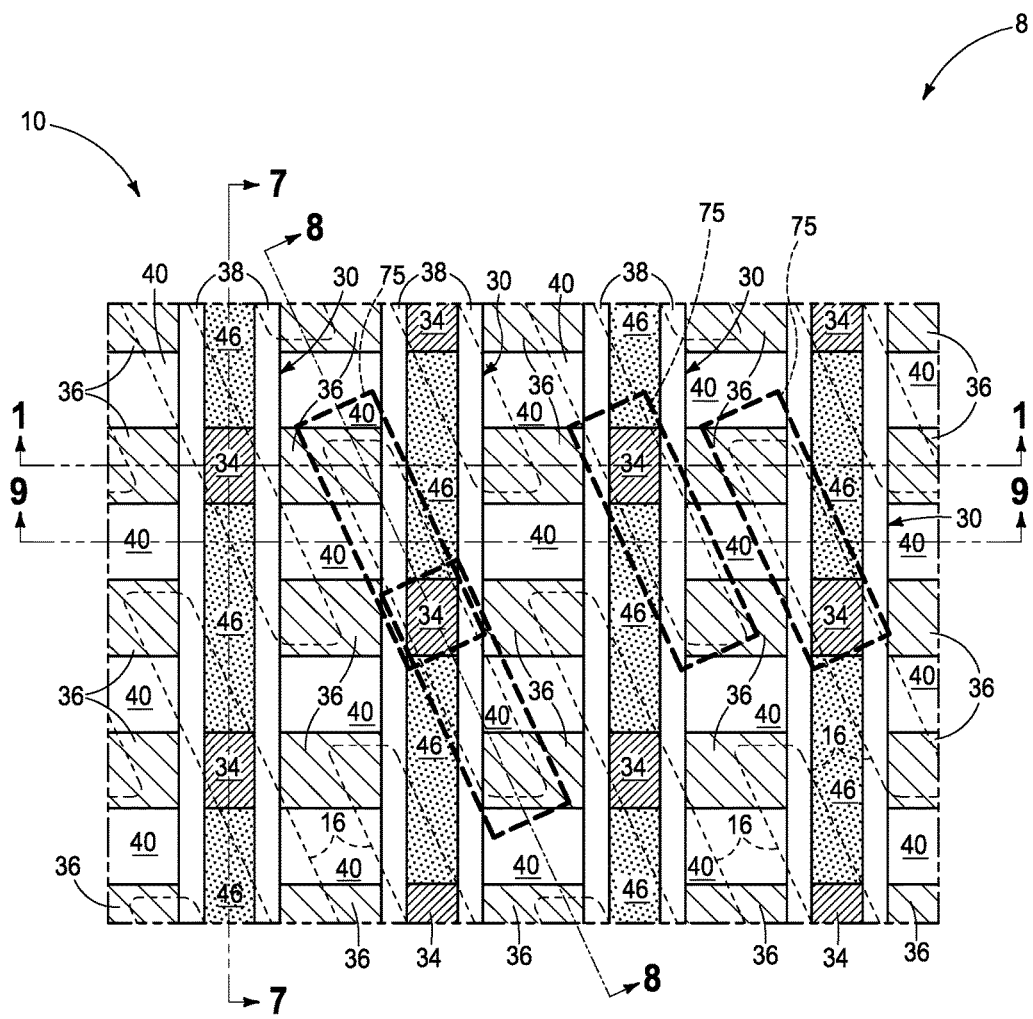
FIG. 4 is a view taken through line 4-4 in FIGS. 1 and 7-9.
Figure 5:
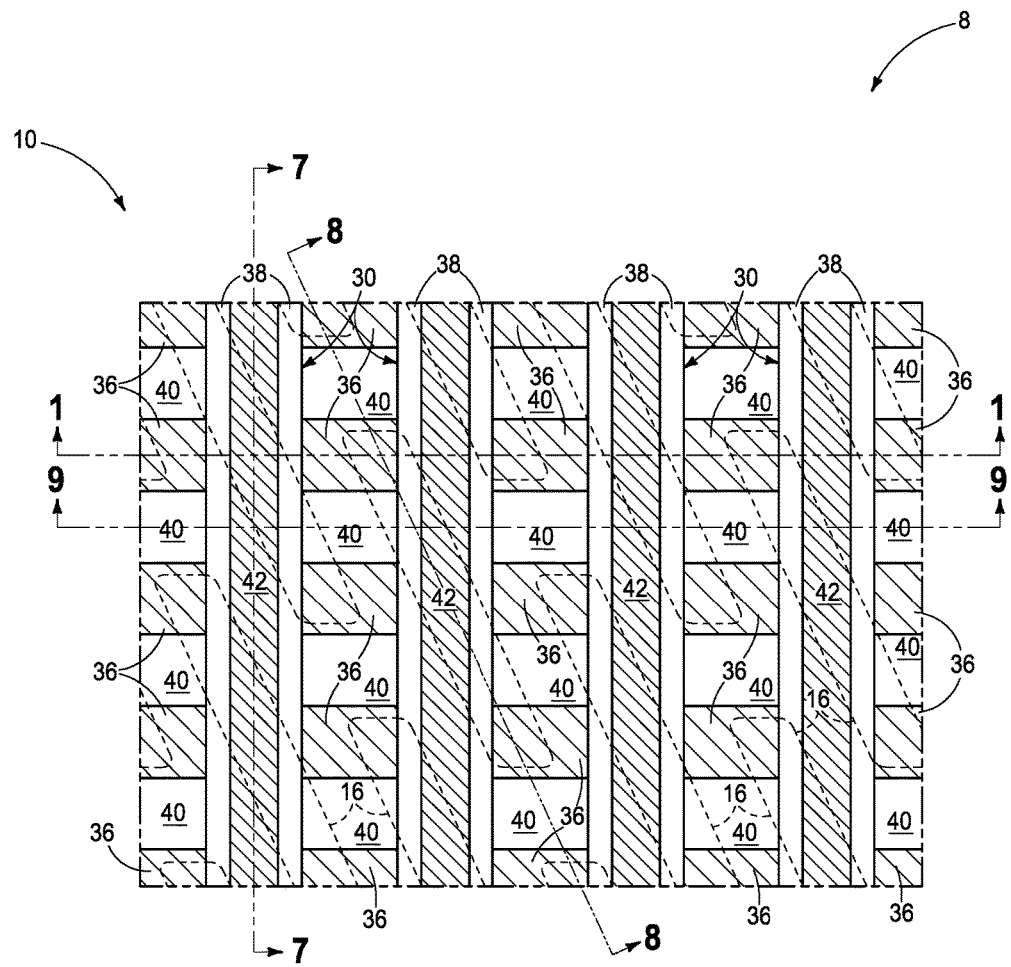
FIG. 5 is a view taken through line 5-5 in FIGS. 1 and 7-9.
Figure 6:
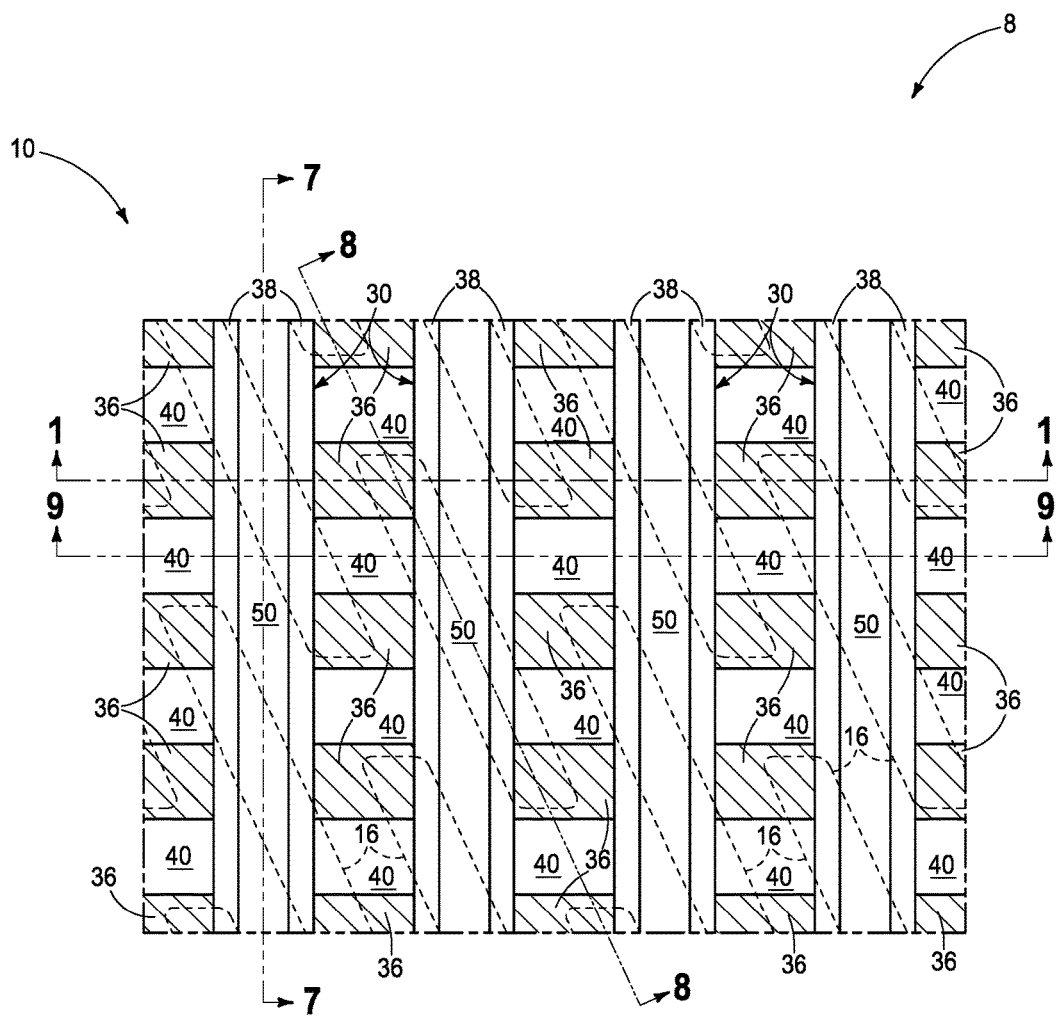
FIG. 6 is a view taken through line 6-6 in FIGS. 1 and 7-9.
Figure 7:
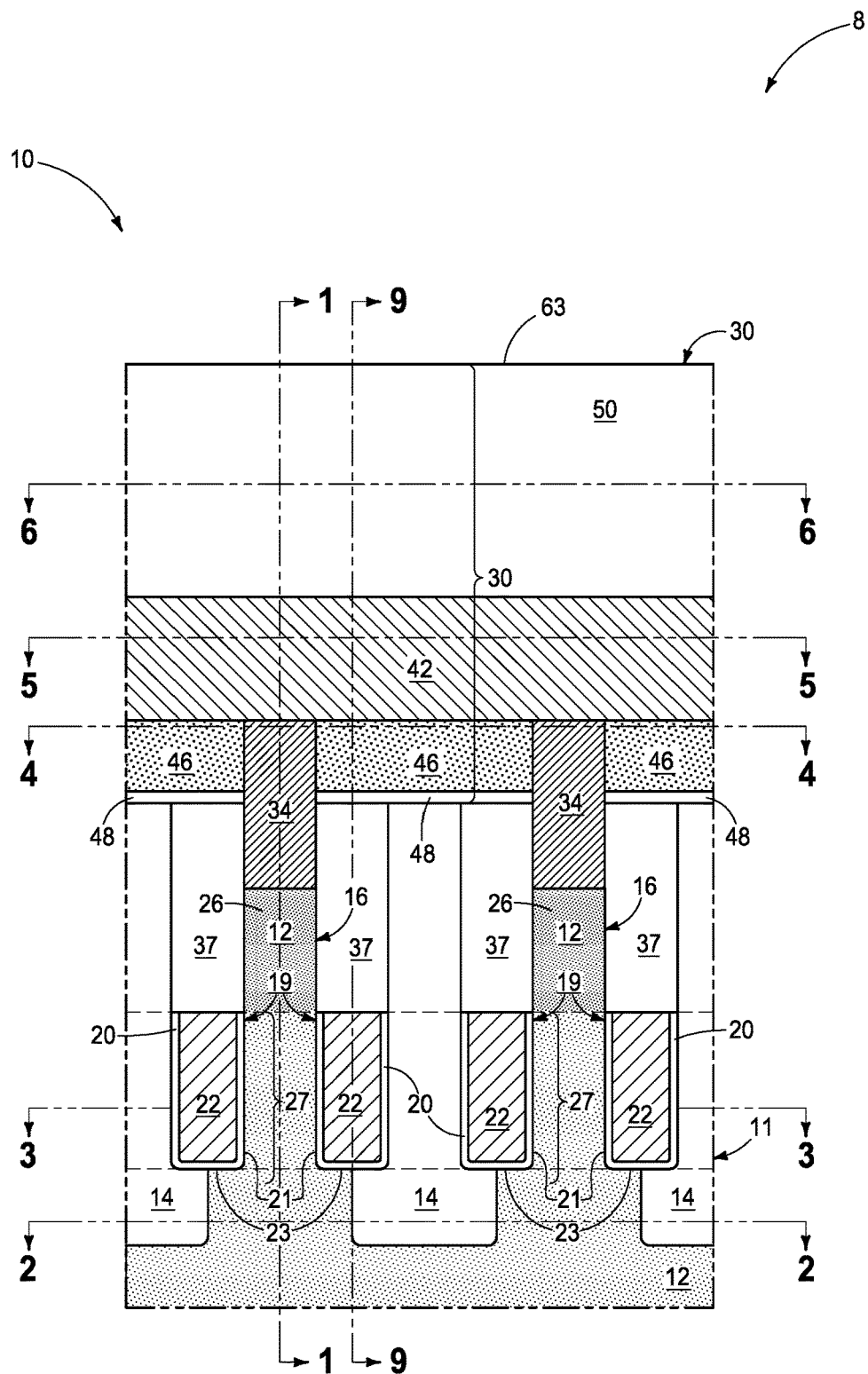
FIG. 7 is a view taken through line 7-7 in FIGS. 1-6 and 9.
Figure 8:
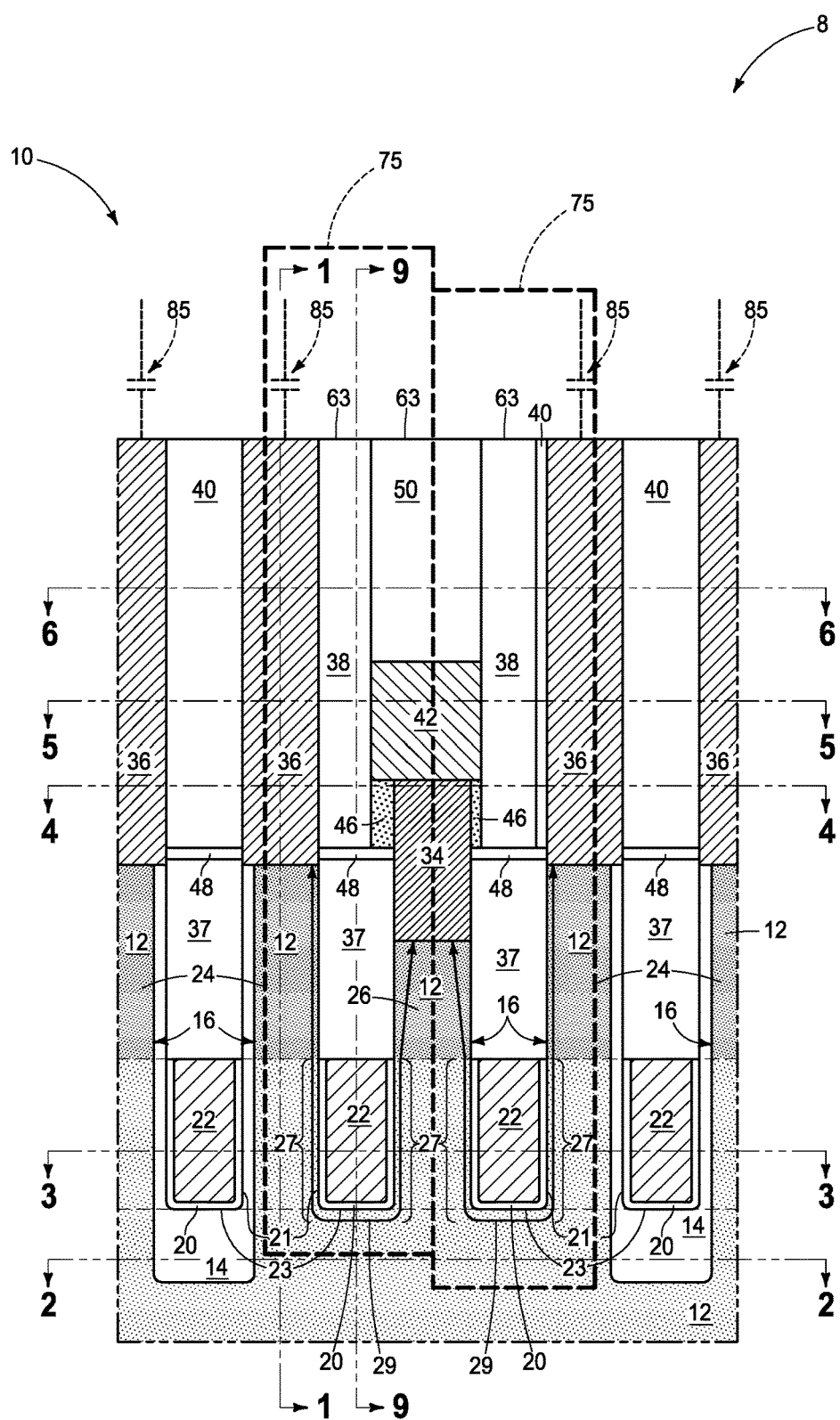
FIG. 8 is a view taken through line 8-8 in FIGS. 2-6.
Figure 9:
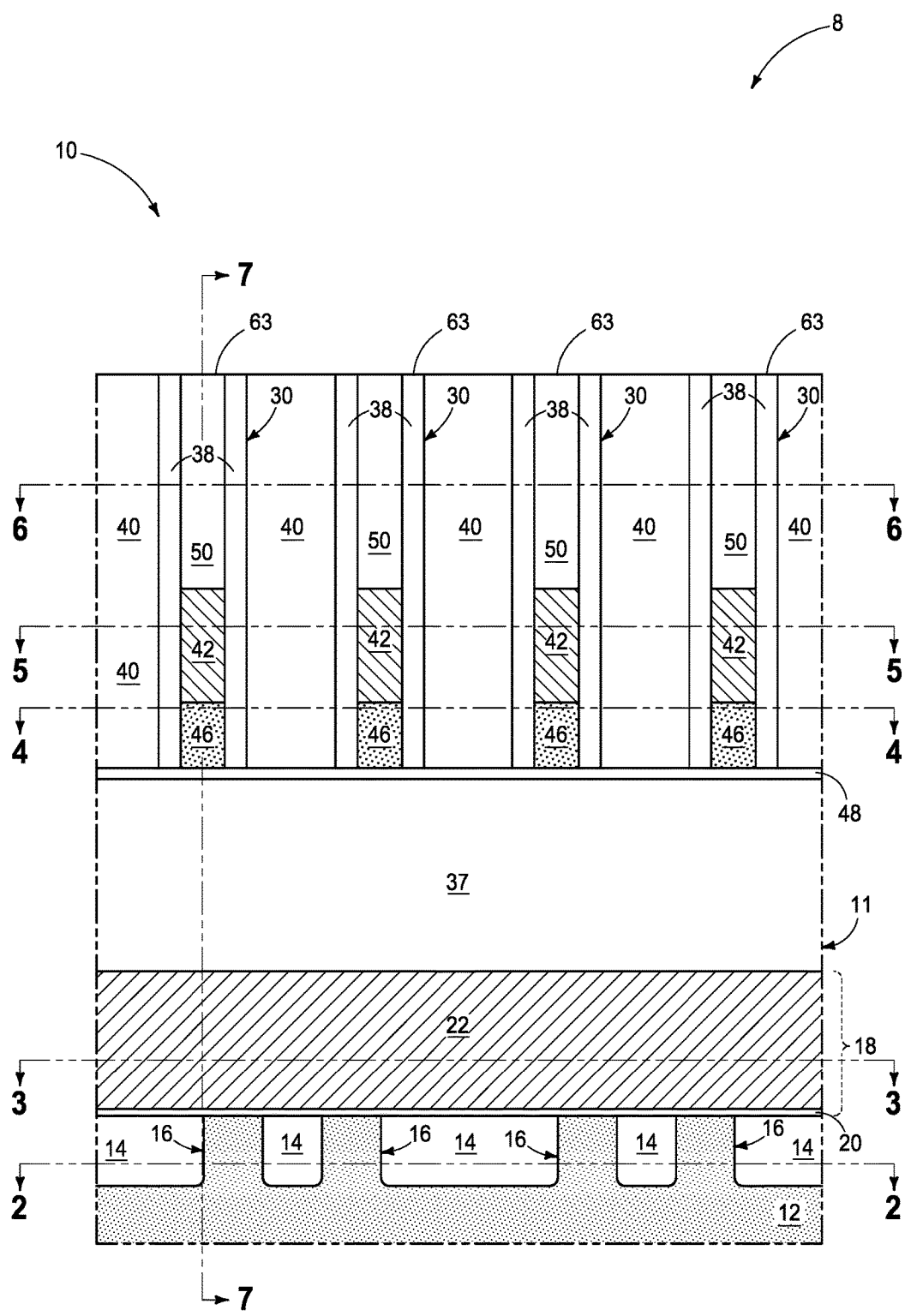
FIG. 9 is a view taken through line 9-9 in FIGS. 2-7.

Embodiments of the invention encompass methods of forming an elevationally-elongated conductive structure of integrated circuitry, methods of forming an array of capacitors, and methods of forming DRAM circuitry. First example embodiments or forming DRAM circuitry are described with reference to FIGS. 1-9 showing an example fragment of a substrate construction 8 comprising an array or array area 10 that has been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-9-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 9, and only four outlines 75 shown in FIG. 4, for clarity in such figures), for example DRAM memory cells, individually comprising a field effect transistor device 25 (FIG. 3) and a charge-storage device (not shown in FIGS. 1-8). However, embodiments of the invention encompass fabricating of other memory cells and other constructions of integrated circuitry independent of whether containing memory cells.

Field effect transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

In one embodiment, digitline structures 30 are formed that individually directly electrically couple to the one shared source/drain region 26 of multiple of the individual pairs of devices 25. Elevationally-extending conductive vias 34 (e.g., metal material and/or conductively-doped semiconductive material) are spaced longitudinally along digitline structures 30. Conductive vias 34 individually directly electrically couple digitline structures 30 to individual of shared source/drain regions 26 of the individual pairs of devices 25.

A pair of capacitors (e.g., dashed lines designated as 85 in FIG. 8, but not yet completely fabricated) will individually directly electrically couple to one of the other source/drain regions 24 in the individual pairs of devices 25. Elevationally-extending conductive vias 36 (same or different composition from that of vias 34) have been formed between and laterally between and spaced longitudinally along digitline structures 30. Vias 36 will individually interconnect individual non-shared source/drain regions 24 with individual capacitors 85 as will be described in more detail below, and in one embodiment are elevationally elongated. In one embodiment, conductive vias 36 predominately comprise (i.e., meaning more than 50% by volume up to and including 100% by volume) polysilicon. Example insulator material 38 and/or 40 (e.g., silicon nitride and/or silicon dioxide) surrounds vias 34, 36.

A channel region 27 is in semiconductive material 12 below pair of source/drain regions 24, 26 along trench sidewalls 21 and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

Example digitline structures 30 individually comprise conductive material 42 (same or different composition from that of conductive vias 34 and/or 36) that is directly electrically coupled to conductive vias 34 and extends between immediately-longitudinally-adjacent of conductive vias 34. Digitline structures 30 comprise upper insulator material 50 (e.g., silicon nitride and/or silicon dioxide) above conductive material 42 and insulator material 38, and may individually be considered as having an uppermost surface 63 that may or may not be planar. Digitline structures 30 also comprise doped or undoped semiconductor material 46 (example thickness of 25 to 250 Angstroms) between immediately-longitudinally-adjacent conductive vias 34. Digitline structures 30 also comprises a lower insulative material 48 (e.g., one or more of silicon dioxide, silicon nitride, aluminum dioxide, hafnium oxide, etc., of an example thickness of 50 to 200 Angstroms) below semiconductor material 46 between immediately-longitudinally-adjacent conductive vias 34. As alternate examples, material 46 may comprise insulative material or metal material or be eliminated with conductive material 42 extending inwardly to lower insulative material 48 (not shown).

Figure 10:
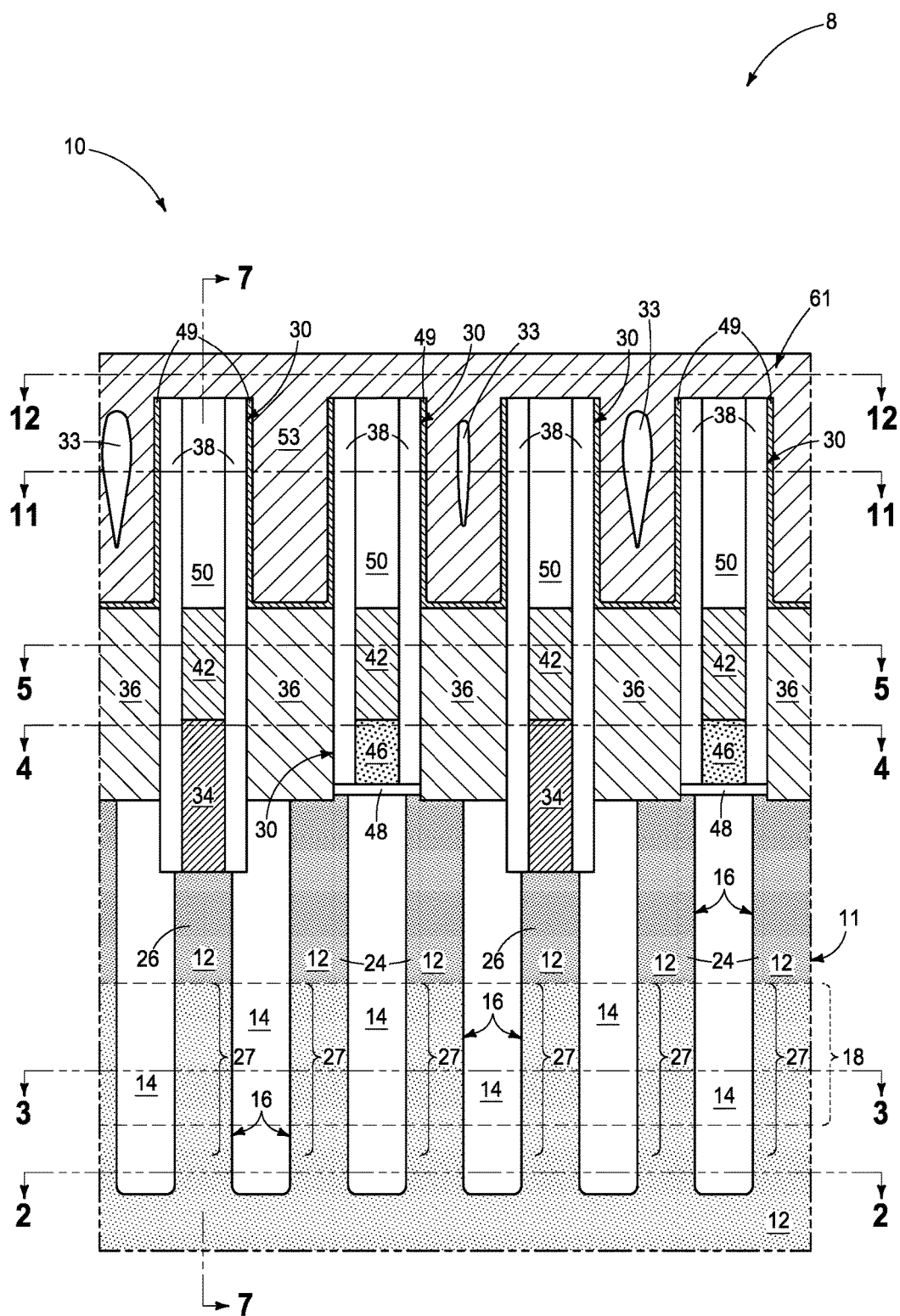
FIG. 10 is a view of the FIG. 1 substrate at a processing step subsequent to that shown by FIG. 1 and is taken through line 10-10 in FIGS. 11 and 12.
Figure 11:
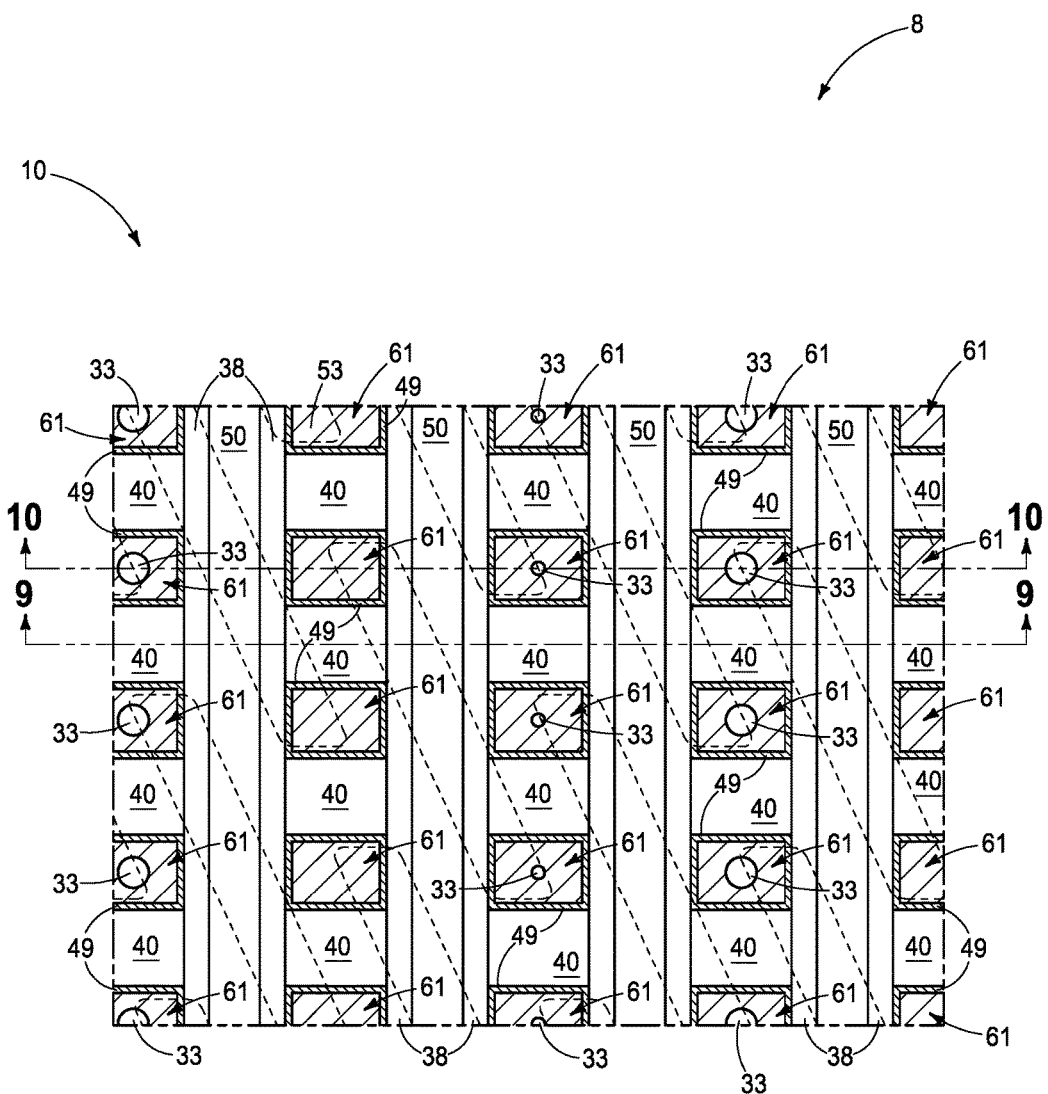
FIG. 11 is a view taken through line 11-11 in FIG. 10.
Figure 12:
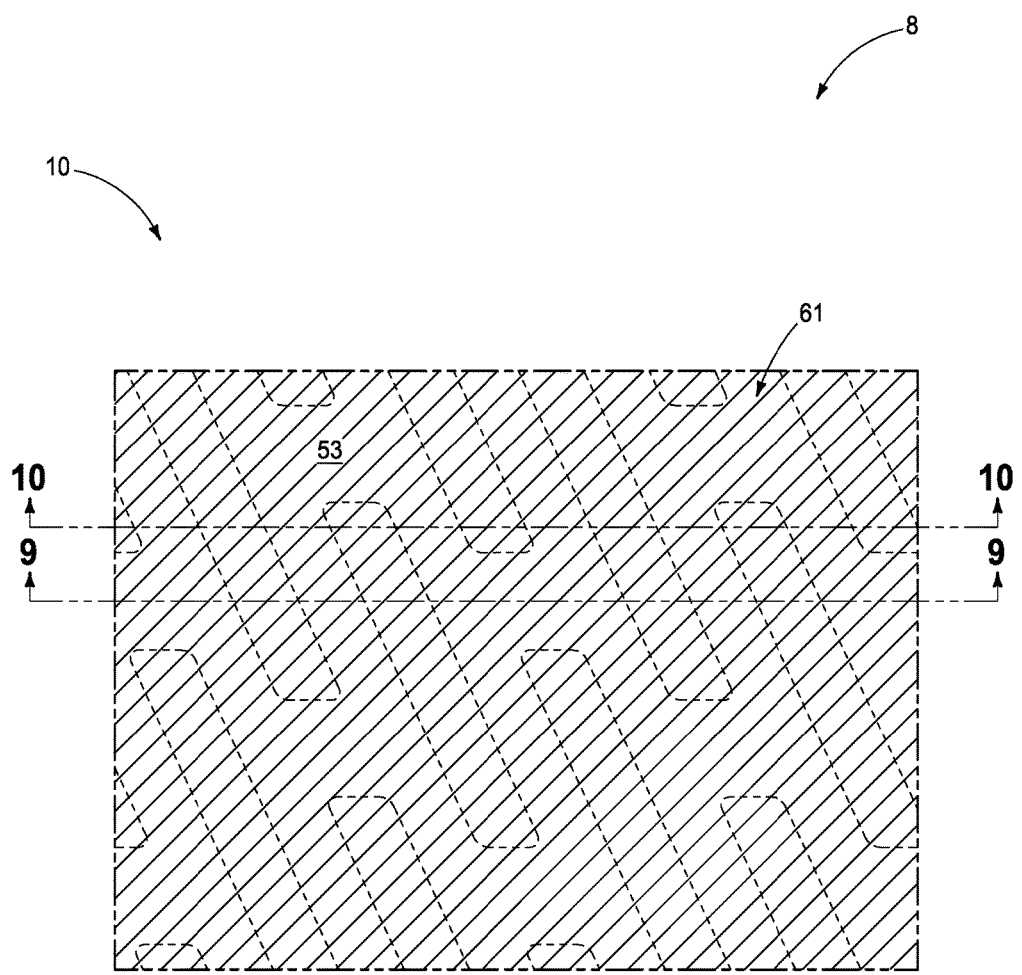
FIG. 12 is a view taken through line 12-12 in FIG. 10.

Referring to FIGS. 10-12, conductive material 61 (e.g., metal material) has been deposited directly above digitline structures 30 and directly above and directly against conductive vias 36 (e.g., in the openings defined by surrounding insulator materials 38 and 40). In one embodiment and as shown, conductive material 61 comprises a lining 49 of one composition (e.g., TiN) and a material 53 of another composition (e.g., elemental-form tungsten) different from the one composition. In one embodiment and as shown, conductive material 61 comprises a vertically-elongated void space 33 therein directly above at least some conductive vias 36, and in one such embodiment as shown directly above less than all of conductive vias 36. Vertically-elongated void spaces 33 may be of different size and/or shape relative one another, for example as shown.

Figure 13:
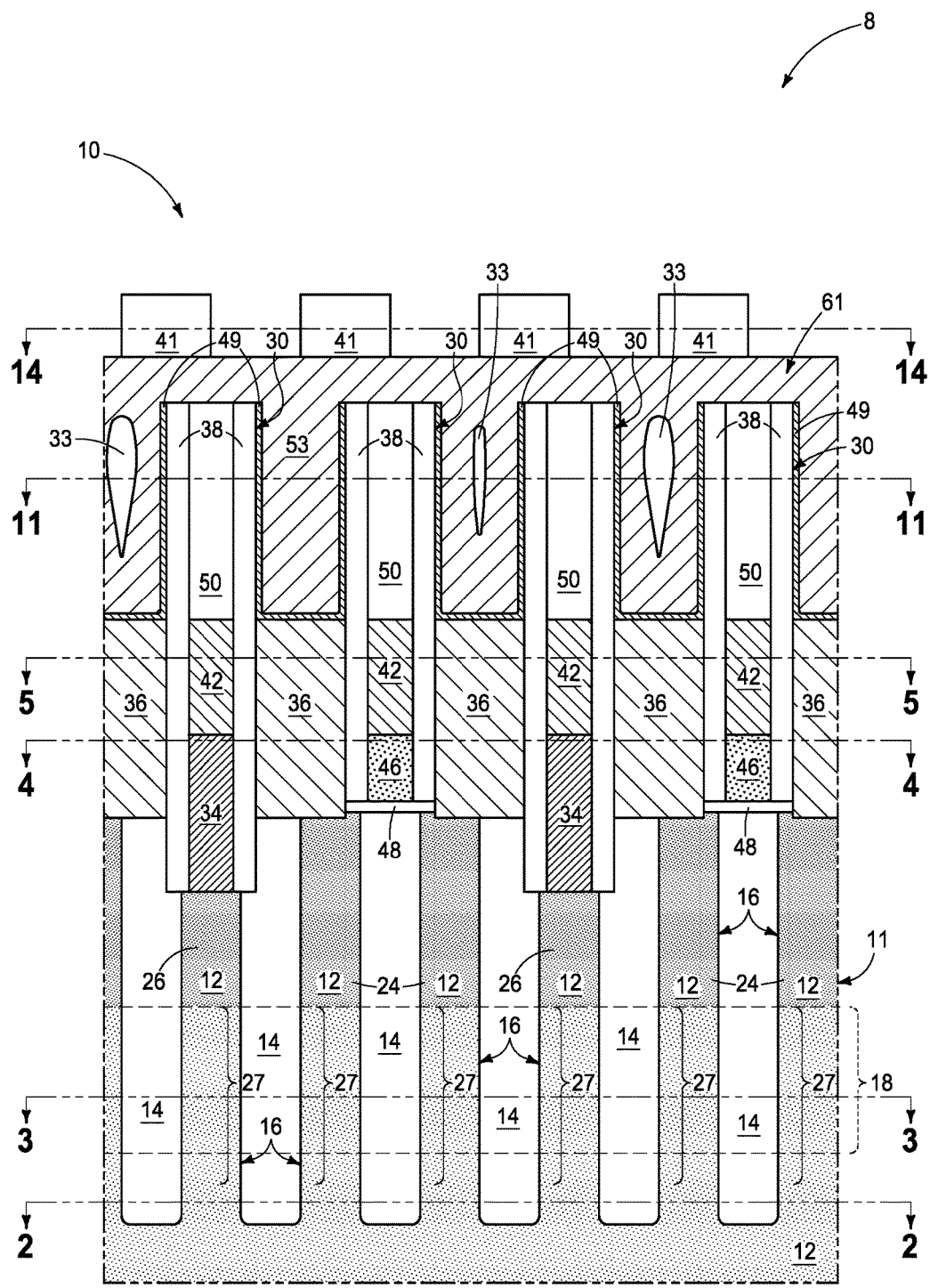
FIG. 13 is a view of the FIG. 10 substrate at a processing step subsequent to that shown by FIG. 10 and is taken through line 13-13 in FIG. 14.
Figure 14:
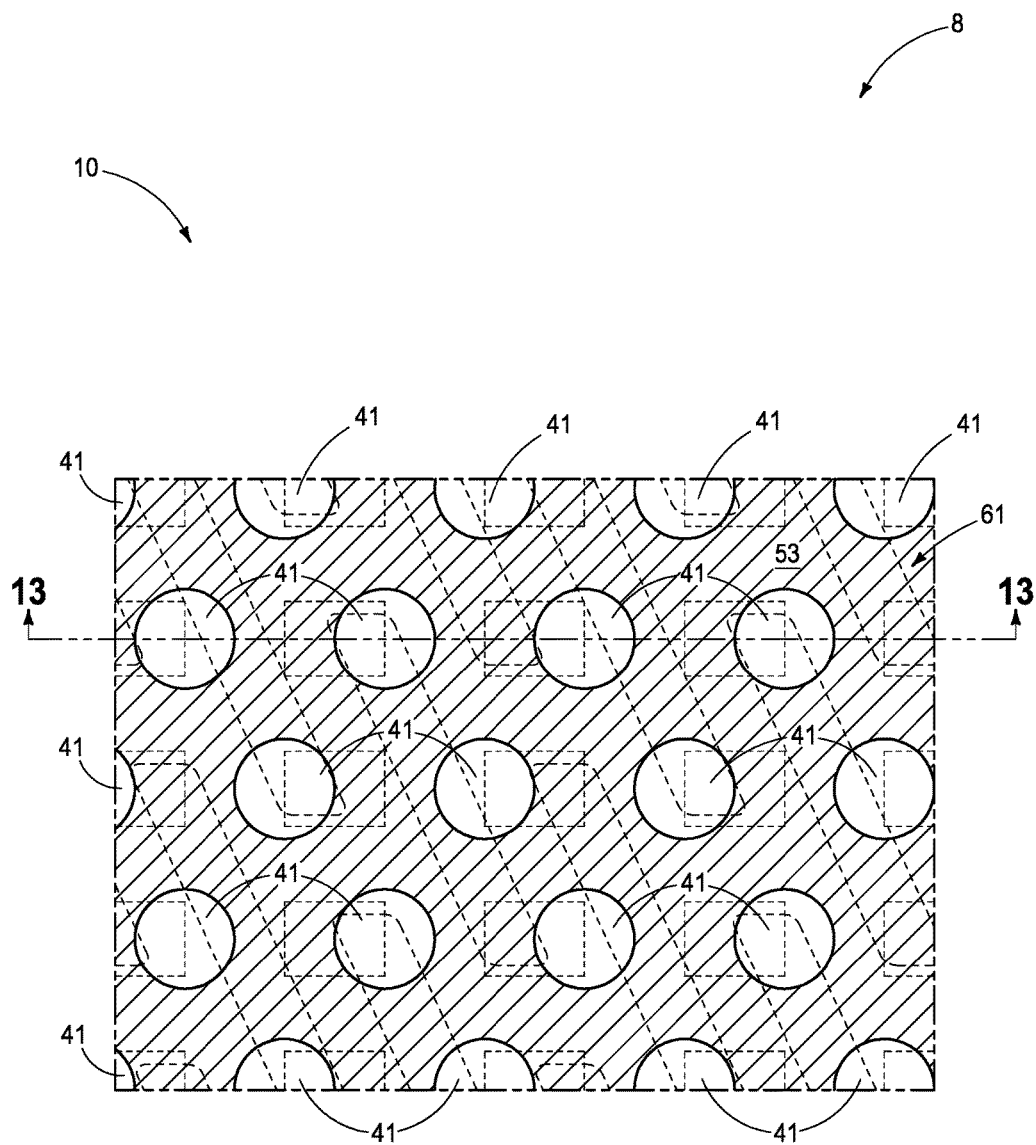
FIG. 14 is a view taken through line 13-13 in FIG. 13.

Referring to FIGS. 13 and 14, and in one embodiment, masking material 41 (e.g., photoresist and/or hard masking material) has been formed and patterned (e.g., subtractively) atop conductive material 61 as shown. Example masses of patterned masking-material 41 are shown as individually having circular horizontal perimeters, although alternate shapes may be used (e.g., square, rectangular, elliptical, oval, triangular, hexagonal, pentagonal, shapes including a combination of curved segment and straight segment sides, etc.) and such horizontal perimeters need not be of the same shape relative one another.

Figure 15:
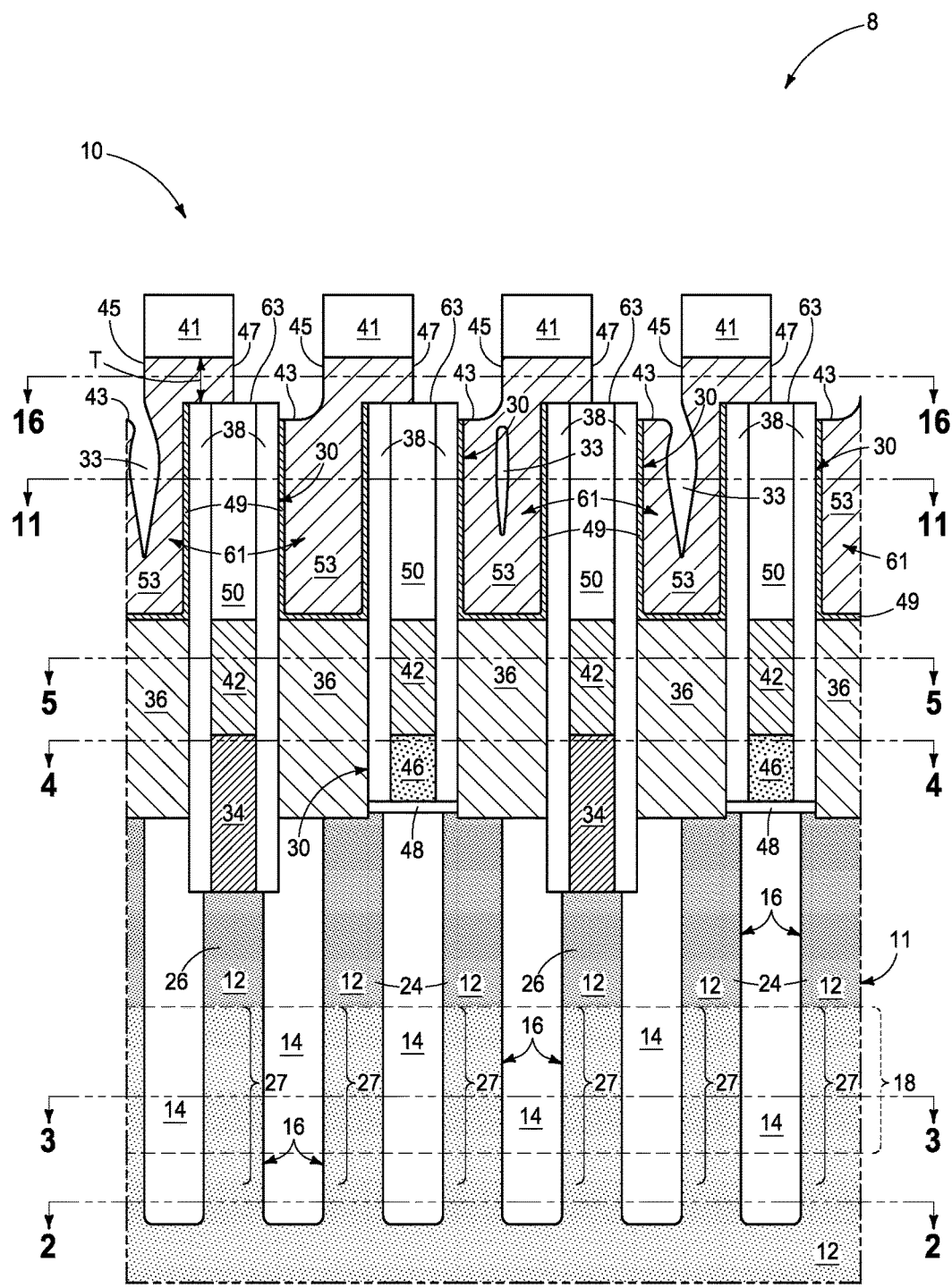
FIG. 15 is a view of the FIG. 13 substrate at a processing step subsequent to that shown by FIG. 13 and is taken through line 15-15 in FIG. 16.
Figure 16:
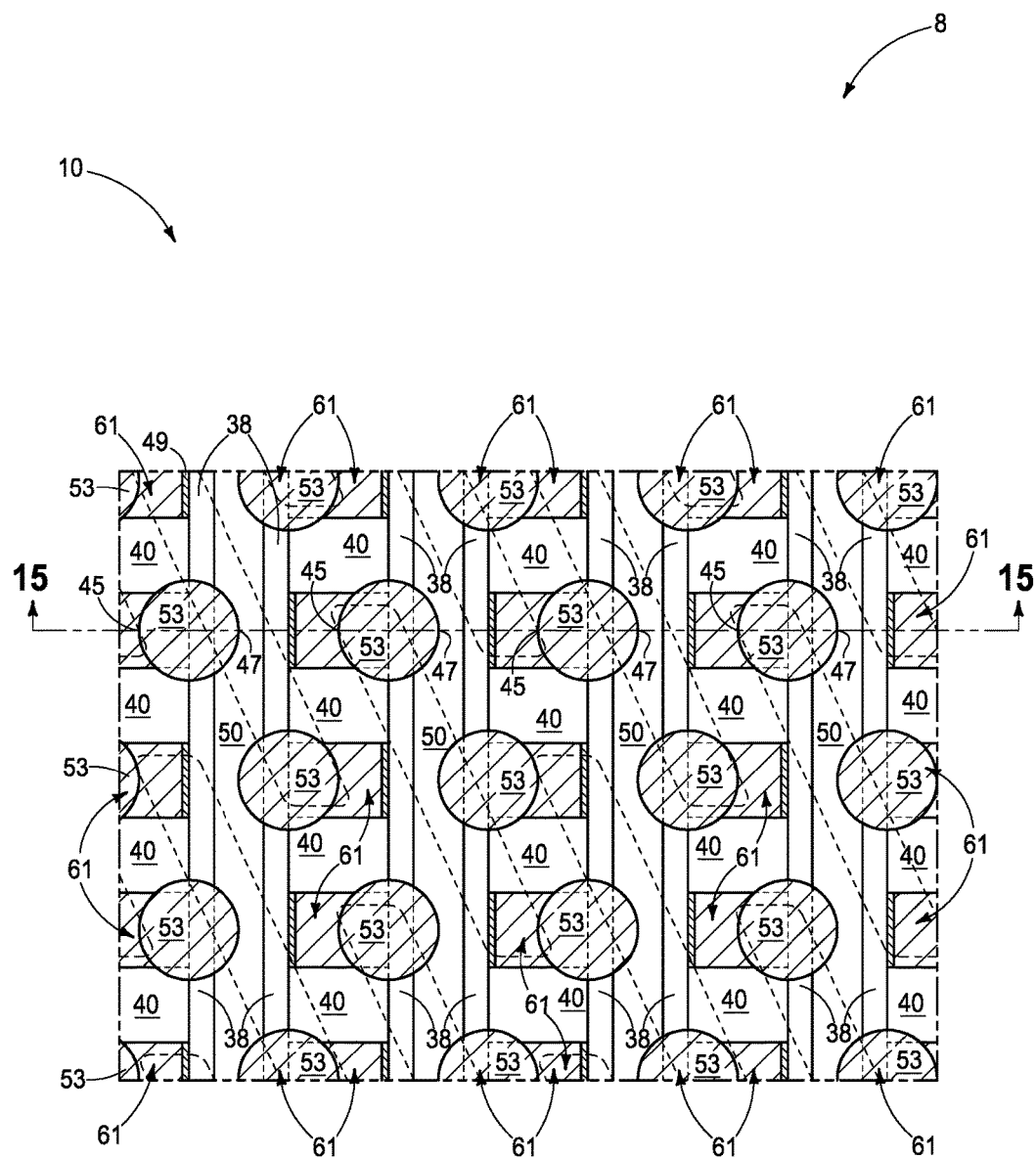
FIG. 16 is a view taken through line 16-16 in FIG. 15.

Referring to FIGS. 15 and 16, etching has been conducted into deposited conductive material 61 to form an upper surface 43 and a first sidewall 45 (i.e., a laterally outer surface of material 61) thereof that are directly above individual conductive vias 36 in a vertical cross-section (e.g., the vertical cross-section that is FIG. 15). Conductive material 61 has a second sidewall 47 (i.e., a different laterally outer surface of material 61) directly above an immediately-laterally-adjacent digitline structure 30 in the vertical cross-section. The etching of material 61 may be conducted anisotropically (e.g., using any suitable dry etching chemistry, with or without plasma, etc.) and may be conducted selectively relative to materials 38, 50, and 40.

The above processing is but one example method of forming such conductive material to have surfaces/sidewalls 43, 45, and 47. In one embodiment, the etching of that portion of deposited conductive material 61 that is directly above the individual conductive vias removes at least 50% of a maximum thickness T (as measured directly above conductive-line structures 30). In one embodiment and as shown, the etching of that portion of deposited conductive material 61 removes all of maximum thickness T, and in one embodiment as shown, more than all, relative to that portion of deposited conductive material 61 that is directly above individual conductive vias 36. In one embodiment where vertically-elongated void spaces 33 are formed as shown, the etching into deposited conductive material 61 upwardly exposes at least some of void spaces 33, and in one embodiment as shown upwardly exposes less than all of void spaces 33. In an alternate embodiment described below, where vertically-elongated void spaces 33 are formed, the etching into deposited conductive material 61 does not upwardly expose any void space 33.

Figure 17:
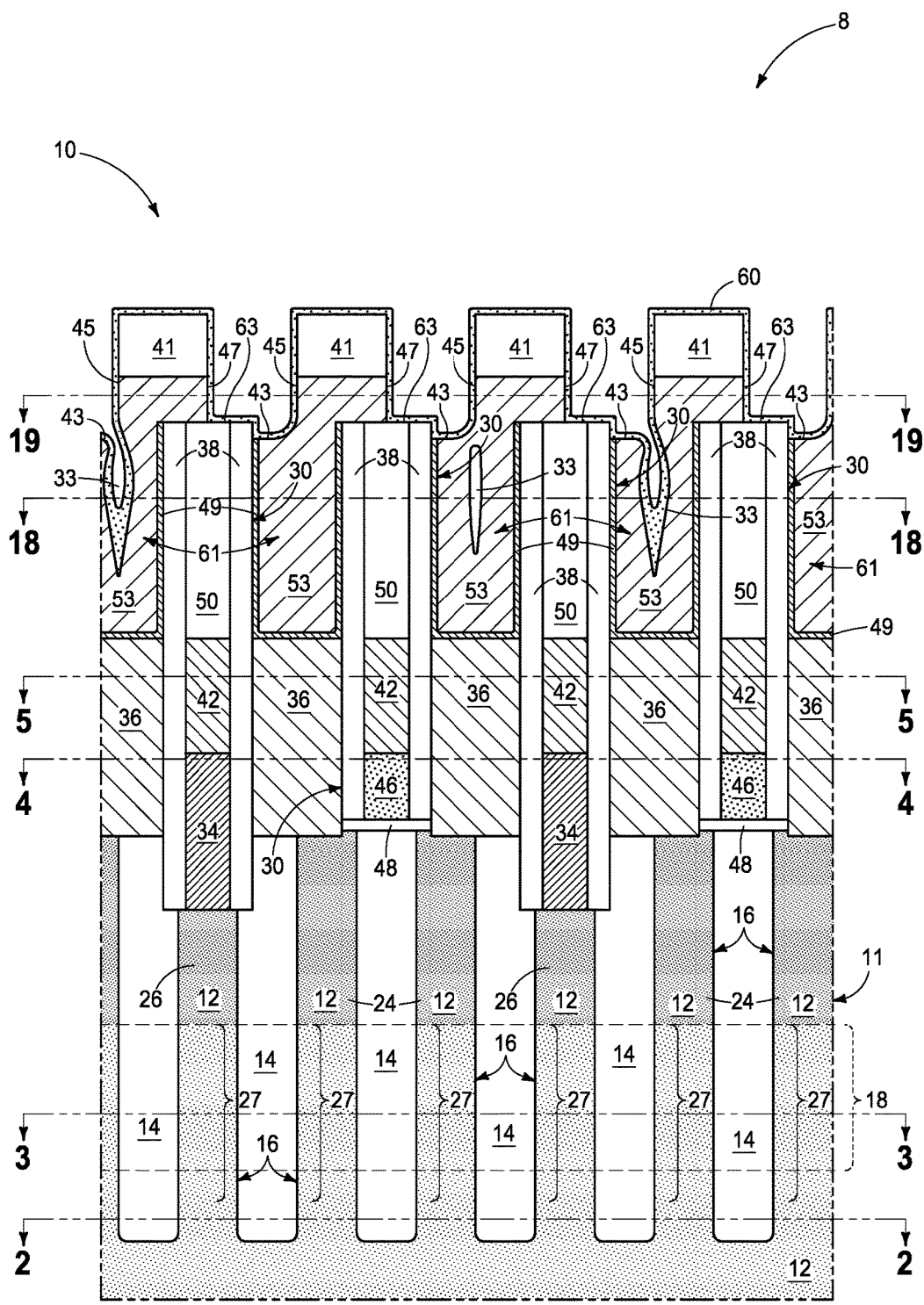
FIG. 17 is a view of the FIG. 15 substrate at a processing step subsequent to that shown by FIG. 15 and is taken through line 17-17 in FIGS. 18 and 19.
Figure 18:
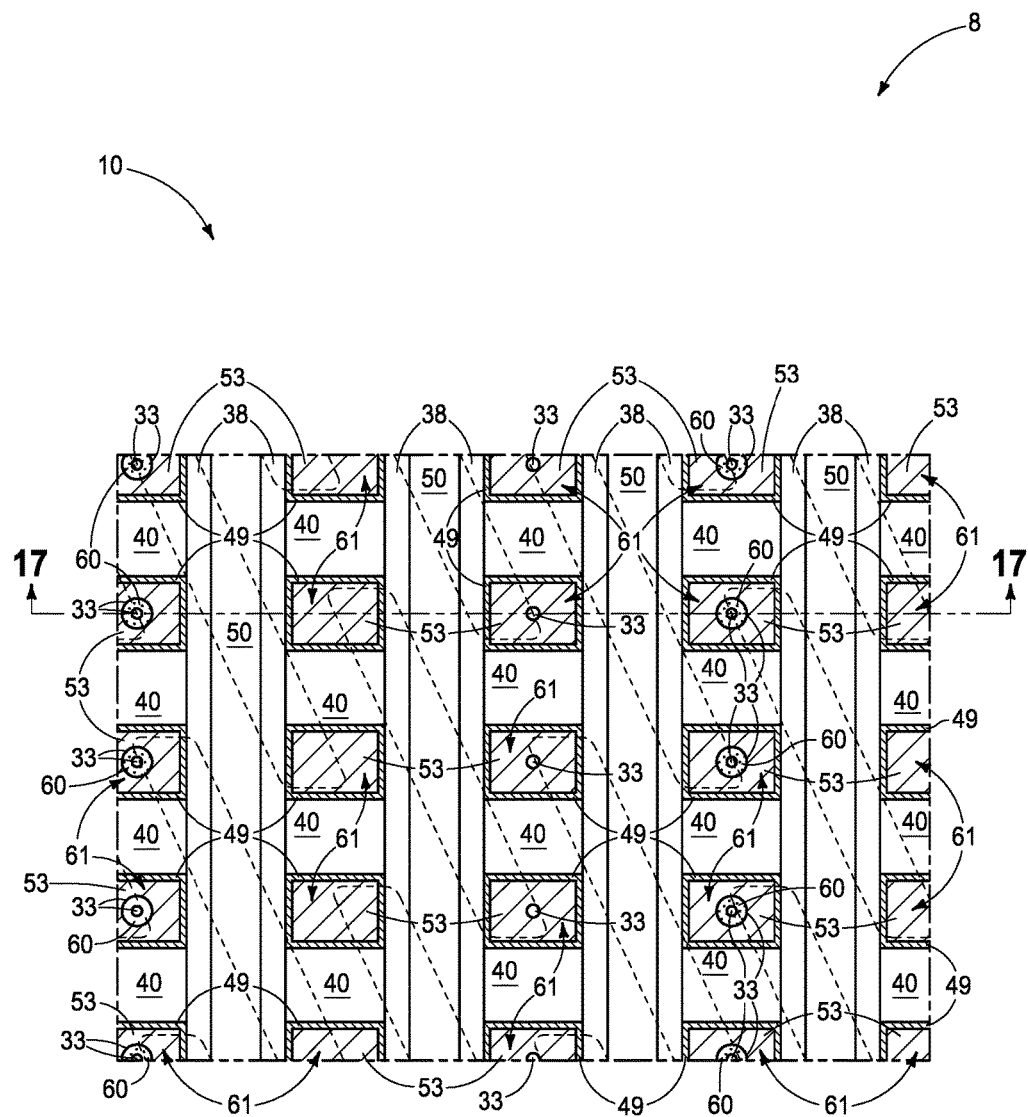
FIG. 18 is a view taken through line 18-18 in FIG. 17.
Figure 19:
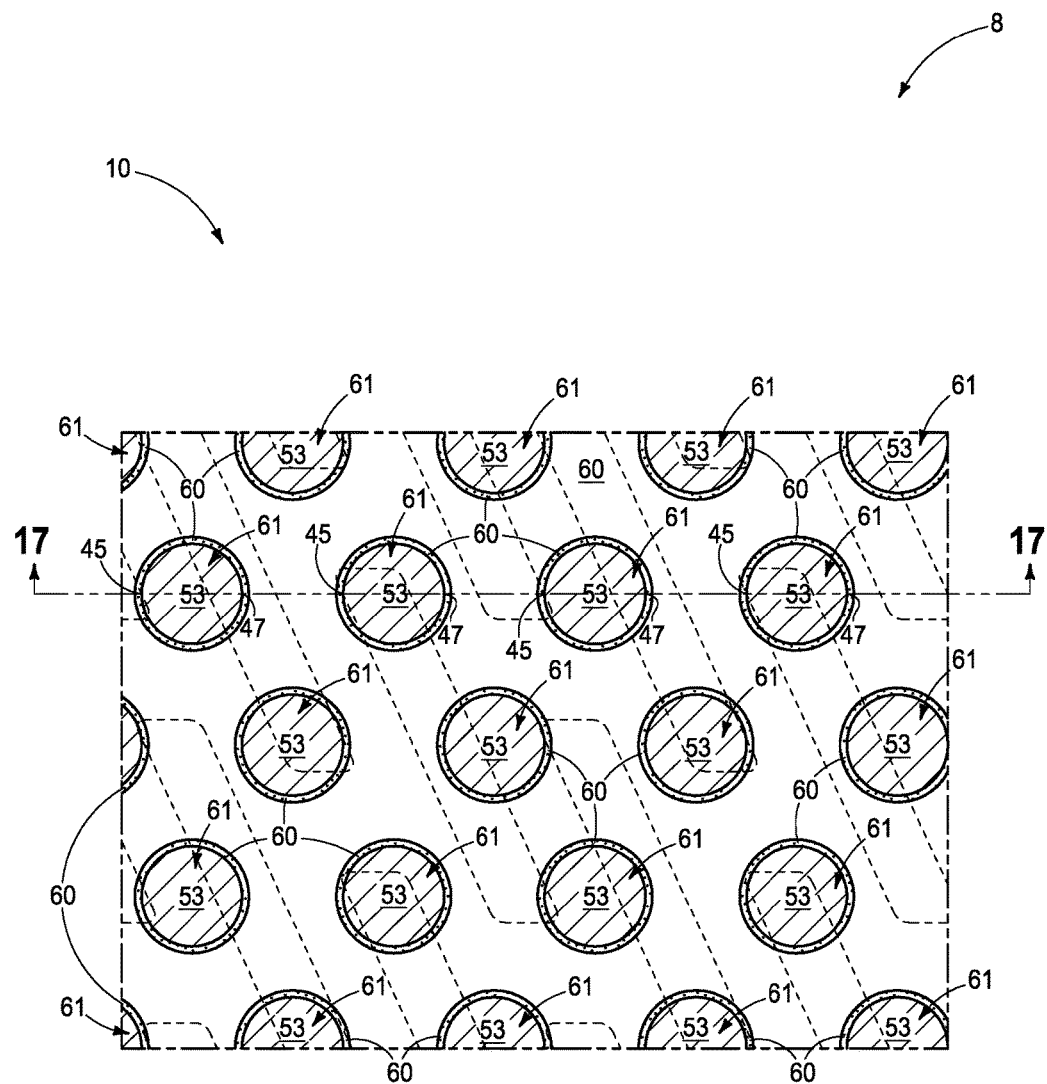
FIG. 19 is a view taken through line 19-19 in FIG. 17.

Referring to FIGS. 17-19, covering material 60 has been formed directly above individual upper surfaces 43 and against (e.g., in one embodiment directly against) individual first sidewalls 45 directly above individual conductive vias 36 (e.g., to a maximum thickness of 10 to 100 Angstroms). Covering material 60 comprises a composition different from that of at least some of conductive material 61. In one embodiment, covering material 60 comprises a composition different from that of conductive material 61 of first sidewalls 45. In one embodiment where void spaces 33 are formed and at least some are upwardly exposed, covering material 60 is formed within such exposed void spaces 33, for example as shown. Covering material 60 may completely fill (not shown) one or more exposed void spaces 33 or may partially fill (as shown) one or more exposed void spaces 33. In one embodiment, covering material 60 is insulative (e.g., silicon dioxide, silicon nitride, aluminum oxide, hafnium oxide, organic polymer, carbon, etc.) and in another embodiment is not insulative (i.e., is conductive and/or semiconductive, such as metal material or conductively-doped semiconductive material or semiconductively-doped semiconductive material). In one embodiment, covering material 60 is formed to have a maximum thickness no greater than 100 Angstroms. In one embodiment, covering material is formed by atomic layer deposition (ALD). In one embodiment and as shown, covering material 60 is also formed against second sidewalls 47 while forming covering material against first sidewalls 45, and in one embodiment as shown covering material 60 is formed against sidewalls and tops of masking material 41.

Figure 20:
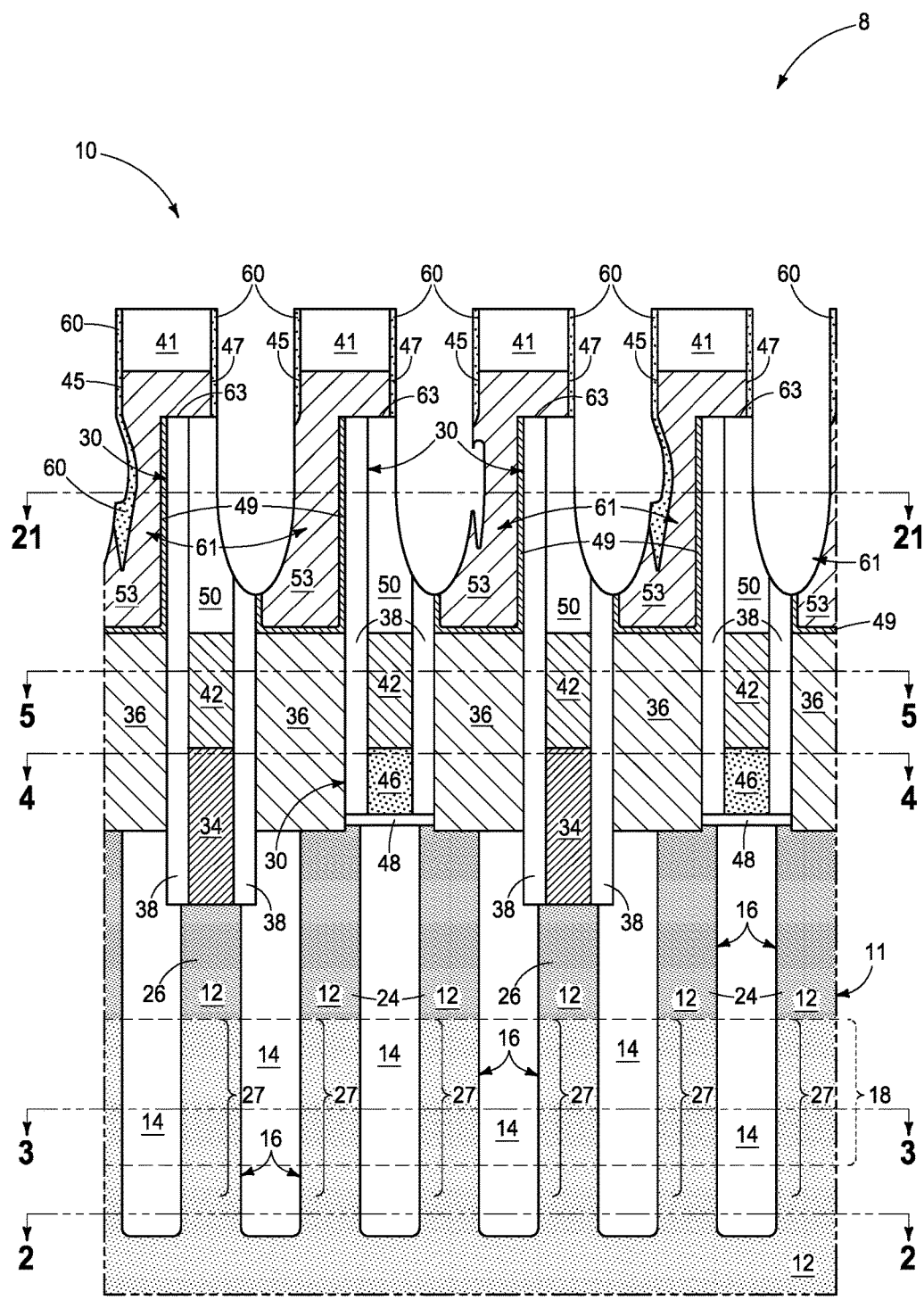
FIG. 20 is a view of the FIG. 17 substrate at a processing step subsequent to that shown by FIG. 17 and is taken through line 20-20 in FIG. 21.
Figure 21:
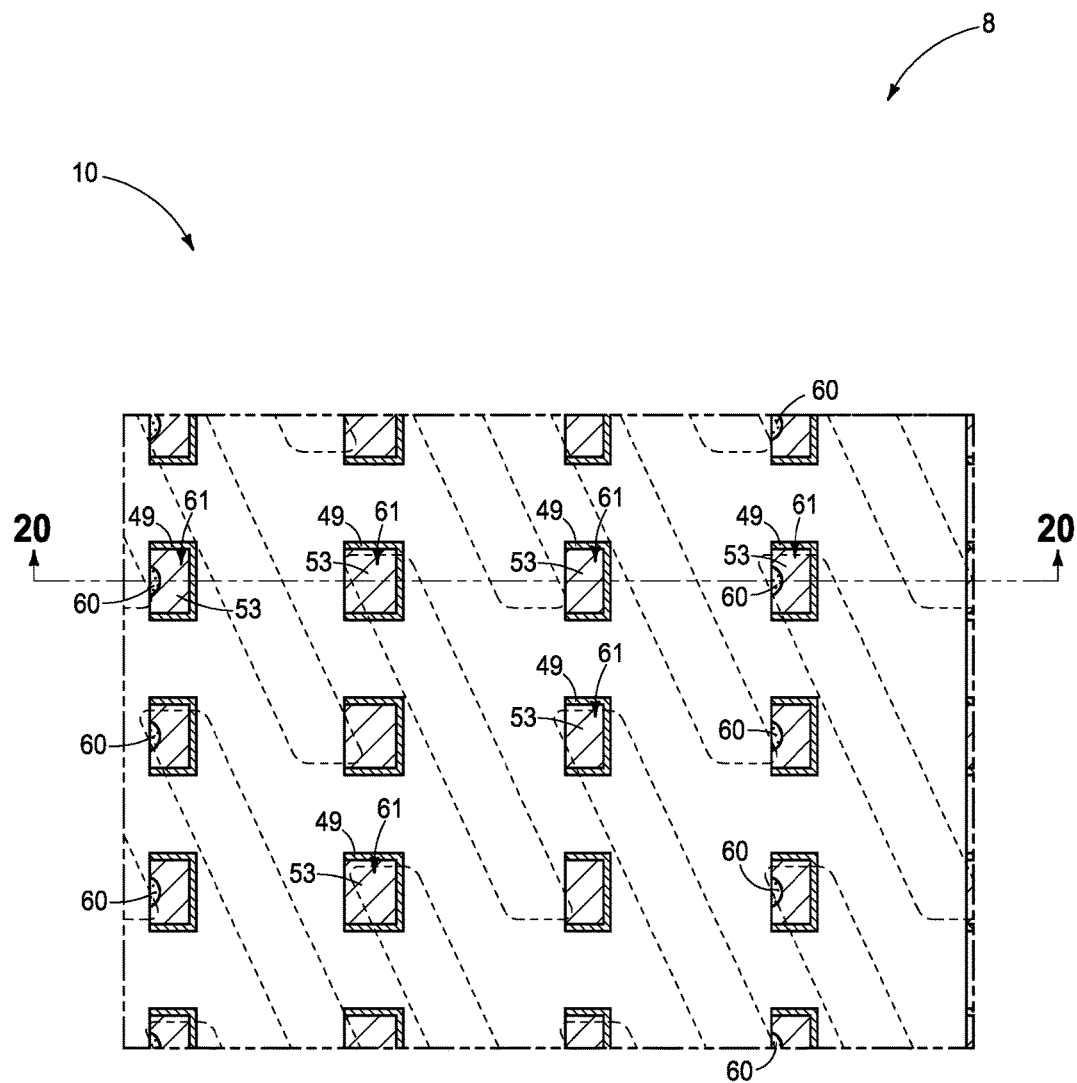
FIG. 21 is a view taken through line 21-21 in FIG. 20.

Referring to FIGS. 20 and 21, etching has been conducted completely through at least some of covering material 60 that is directly above individual upper surfaces 43 to conductive material 61 directly there-below and further etching has been conducted into conductive material 61 directly below such removed covering material 60 and below uppermost surfaces 63 of digitline structures 30. Covering material 60 that is against individual first sidewalls 45 masks those individual first sidewalls from being etched during the acts of etching through the covering material and etching into conductive material 61 directly there-below. The etching may be conducted anisotropically (e.g., using any suitable dry etching chemistry, with or without plasma, etc.) and may be conducted completely selectively (not shown) or non-selectively (as shown) relative to materials 38, 50, and 40. Further and regardless, the collective processing shown by FIGS. 15-20 may be conducted in situ in the same processing chamber without removing the substrate from such chamber at any time during such collective processing. Regardless, in one embodiment, the etching of that portion of conductive material 61 that is directly above individual conductive vias 36 removes at least 20% of the maximum thickness T (as measured of conductive material 61 that is directly above digitline structures 30). In one embodiment and as shown, etching has also been conducted into some, and only some, material of digitline-structures 30 (e.g., some of materials 50 and 38) while etching into conductive material 60.

Figure 22:
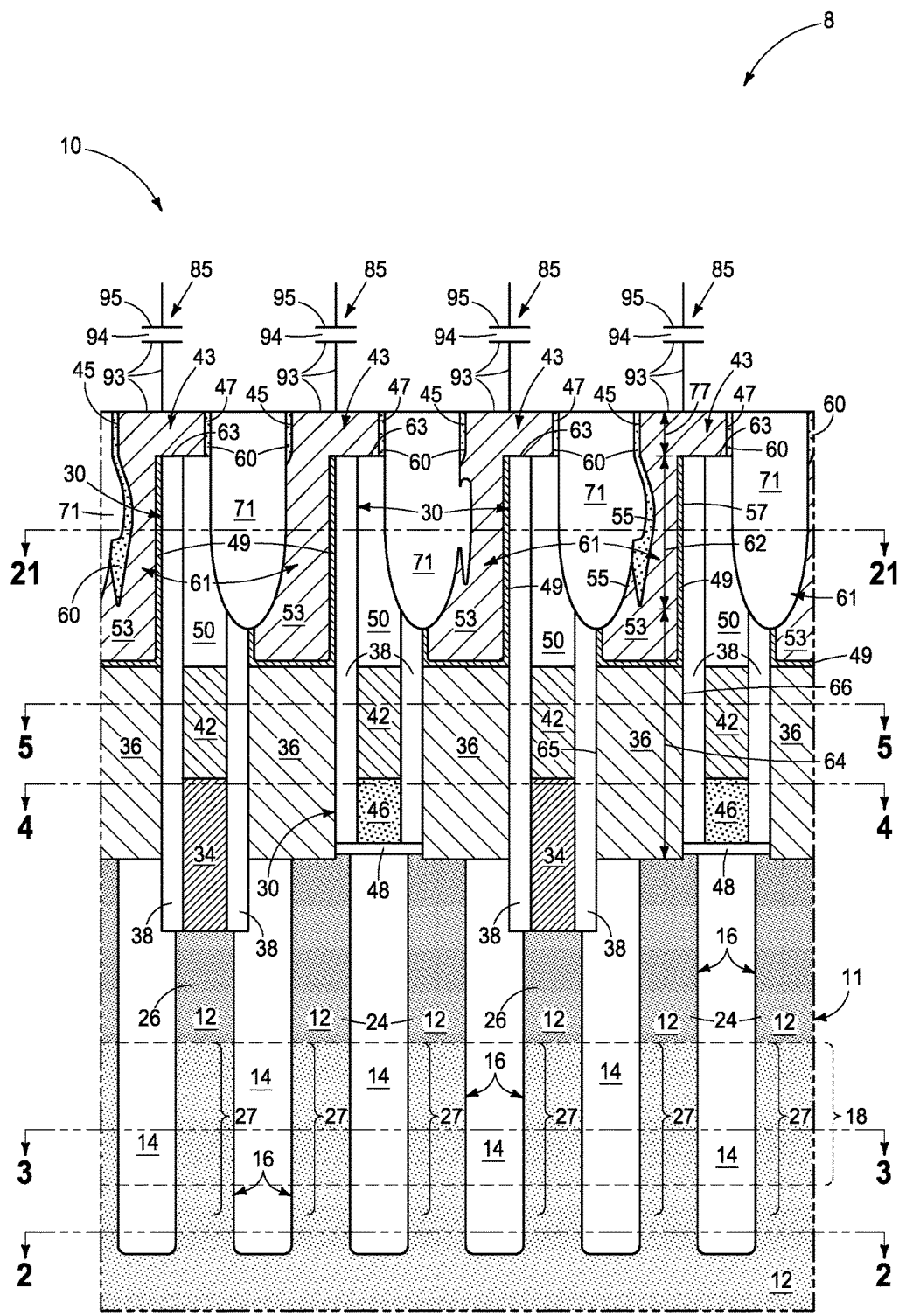
FIG. 22 is a view of the FIG. 20 substrate at a processing step subsequent to that shown by FIG. 20.
Figure 23:
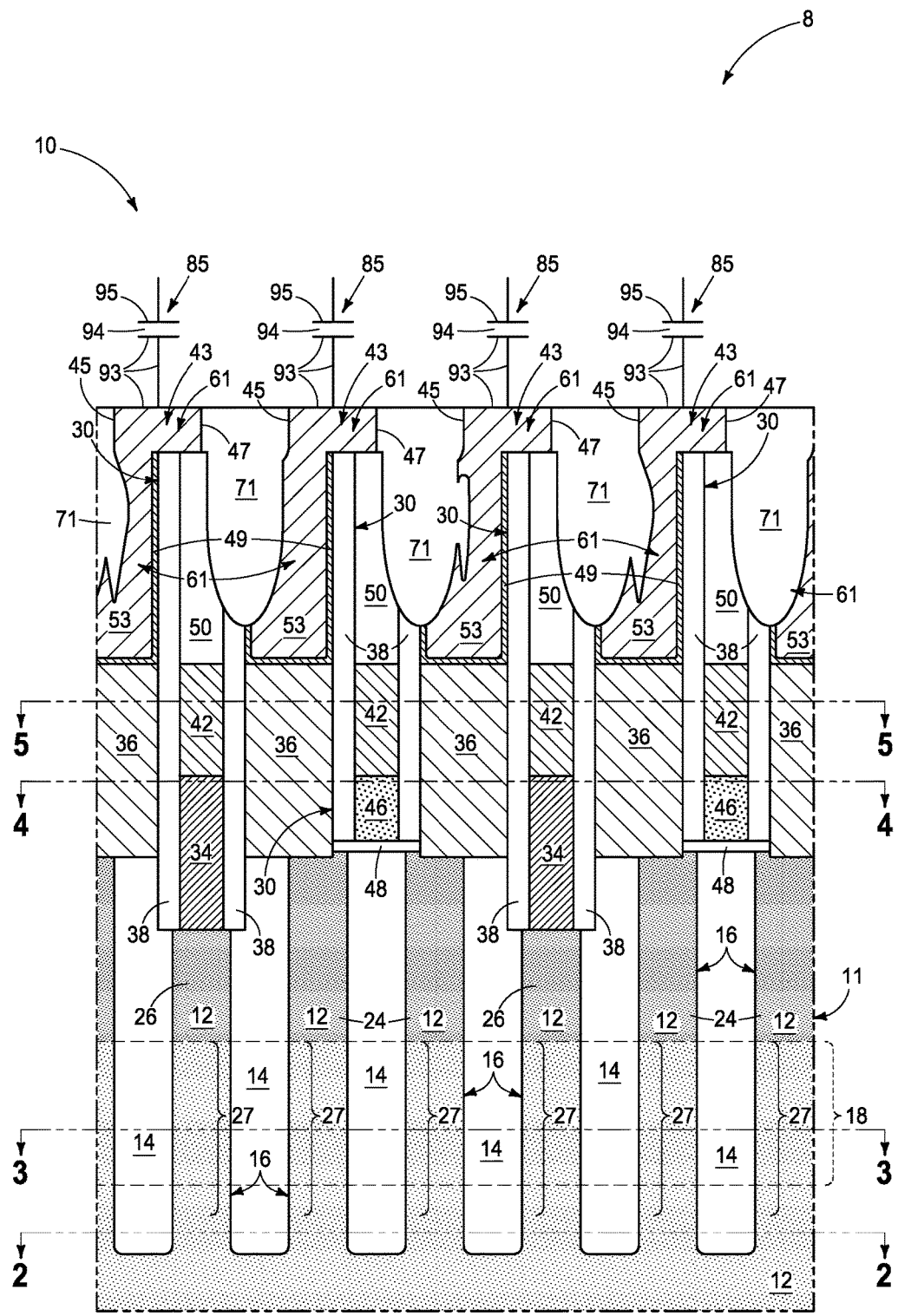
FIG. 23 is a diagrammatic cross-sectional view of a portion of an alternate embodiment DRAM construction to that shown in FIG. 22.

Referring to FIG. 22, masking material 41 (not shown) has been removed and insulator material 71 (e.g., silicon dioxide and/or silicon nitride) has been deposited and planarized back as shown. A plurality of capacitors 85 has been formed which are largely schematically shown in FIG. 22 (and in FIG. 8). Capacitors 85 individually comprise a lower conductive electrode 93, an upper conductive electrode 95, and a capacitor insulator 94 there-between. Individual lower electrodes 93 comprise conductive material 61 that is directly above immediately-laterally-adjacent individual digitline structures 30. Conductive material 61 in some embodiments may be considered as a redistribution layer (RDL) (i.e., an upper layer of integrated circuitry that comprises metal material and that makes input/output nodes for the integrated circuitry available in or at other locations). In one embodiment and as shown, at least some of covering material 60 that is against first sidewalls 45 remains in a finished integrated circuitry construction. In another embodiment, all remaining covering material 60 is removed prior to forming capacitor insulator 94 (see an alternate embodiment in FIG. 23 where no covering material 60 is shown). Regardless, formation of covering material 60 that remains over first sidewalls 45 below digitline structures 30 during etching of conductive material 61 there-below may reduce or preclude a tendency to laterally etch through conductive material 61 that would create a fatal "open" whereby capacitor 85 would not be directly electrically coupled to source/drain regions 24.

Any other attribute(s) or aspect(s) as shown and/or described herein with respect to other embodiments may be used.

Figure 24:
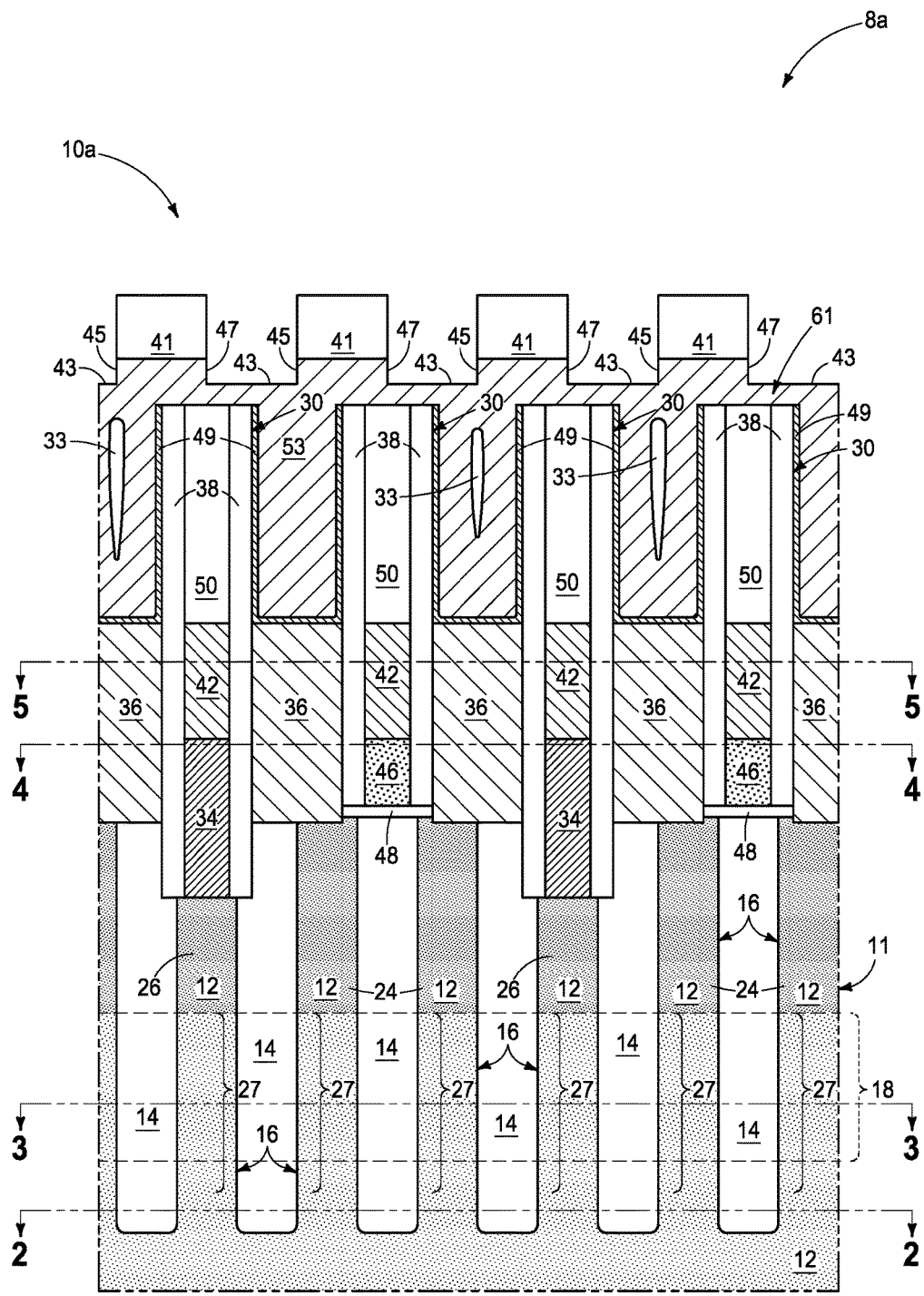
FIG. 24 is a diagrammatic cross-sectional view of a portion of an alternate embodiment DRAM construction in process in accordance with some embodiments of the invention and is an alternate to the processing shown by FIG. 15.

An alternate example method embodiment is shown and next described with reference to FIGS. 24-26 with respect to a construction 8a. Like numerals from the above-described embodiments have been used where appropriate, with some construction differences being indicated with the suffix "a" or with different numerals. Referring to FIG. 24, such shows alternate processing to that shown by FIG. 15, and with some void spaces 33 being narrowed for clarity is showing this alternate embodiment. Etching has been conducted into deposited conductive material 61 to form upper surface 43, first sidewall 45, and second sidewall 47. The etching of that portion of deposited conductive material 61 that is directly above the individual conductive vias is conducted to remove no more than 85% of maximum thickness T (as measured directly above conductive-line structures 30).

Figure 25:
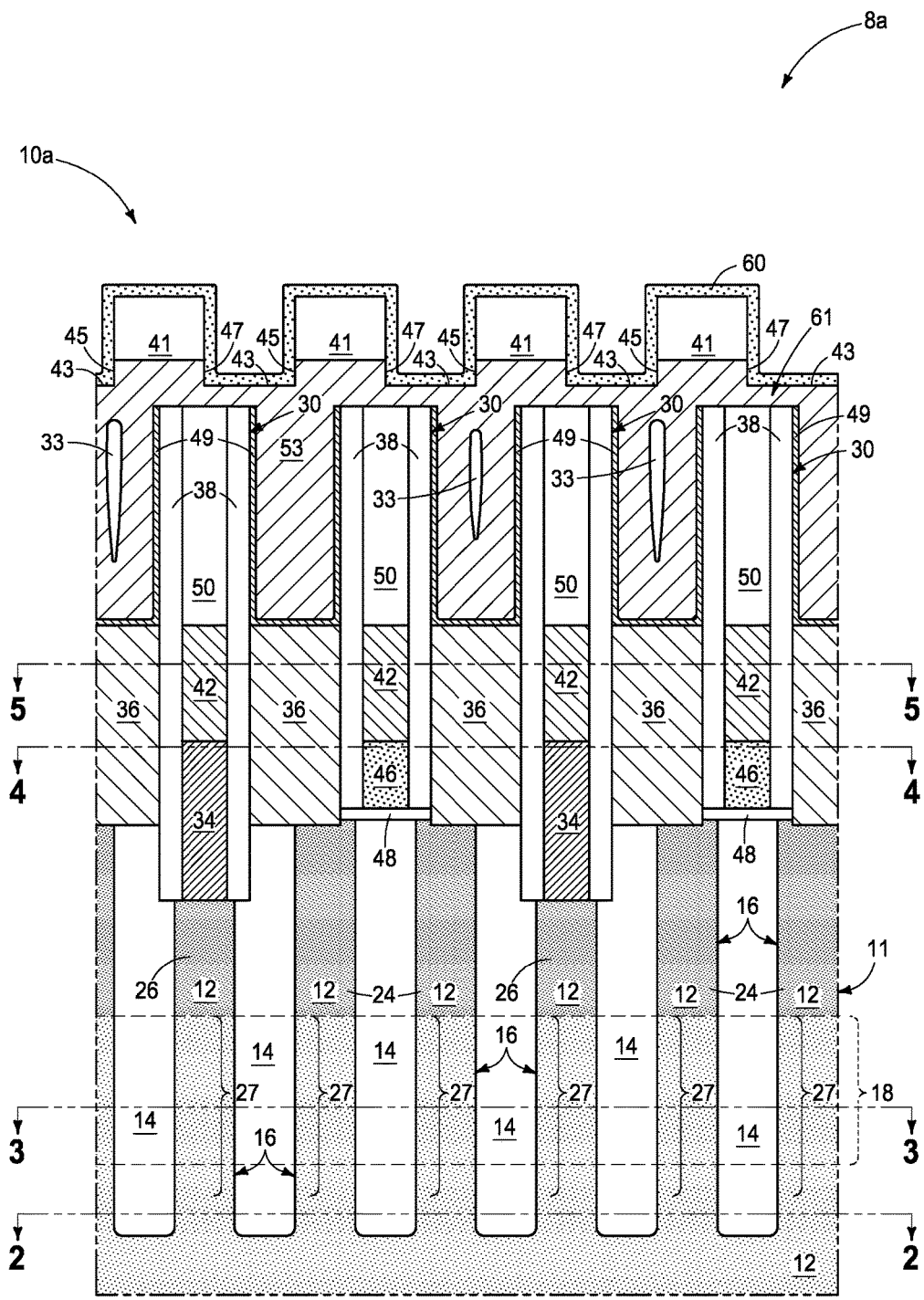
FIG. 25 is a view of the FIG. 24 substrate at a processing step subsequent to that shown by FIG. 24.

Referring to FIG. 25, covering material 60 has been formed.

Figure 26:
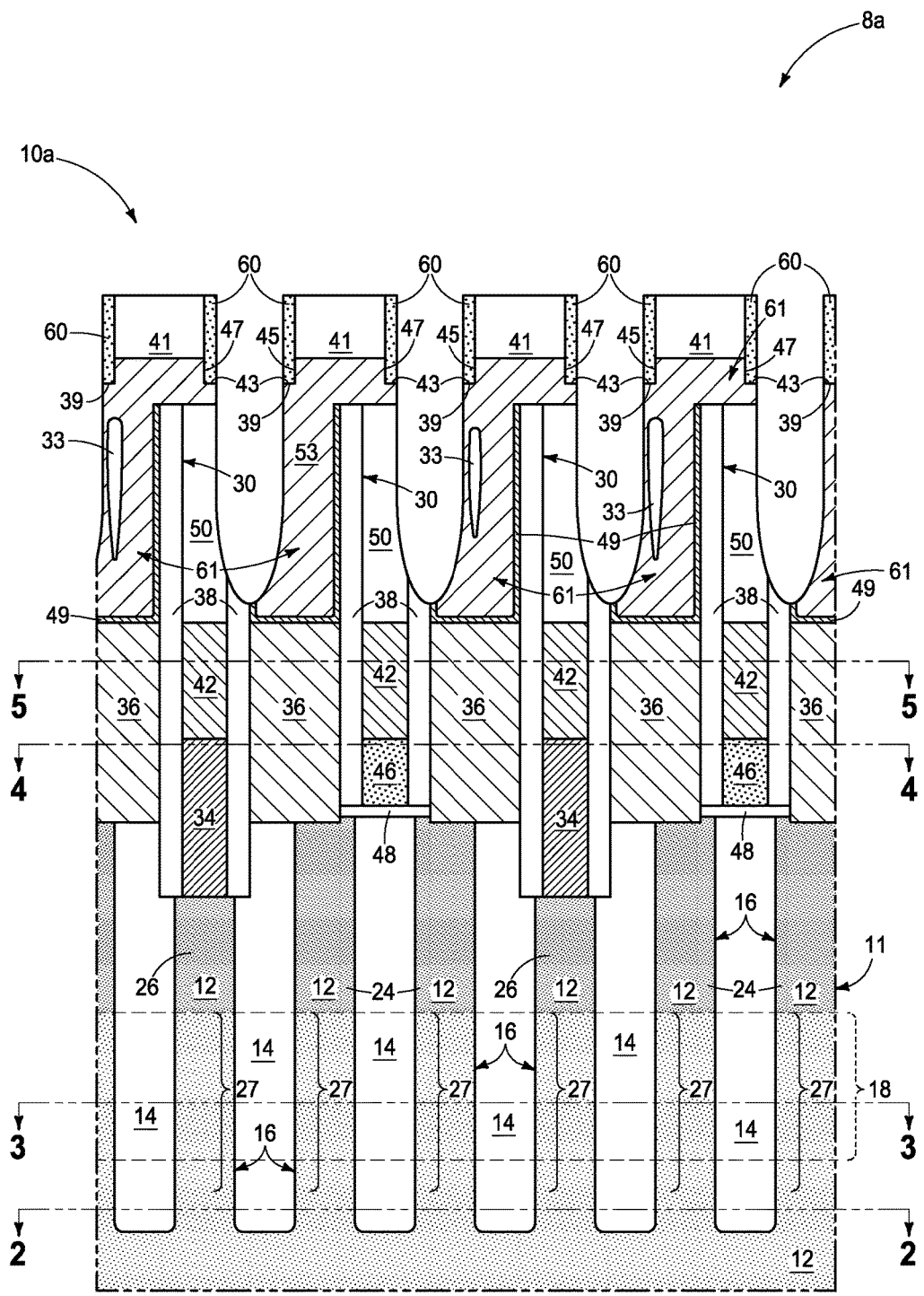
FIG. 26 is a view of the FIG. 25 substrate at a processing step subsequent to that shown by FIG. 25.
Figure 27:
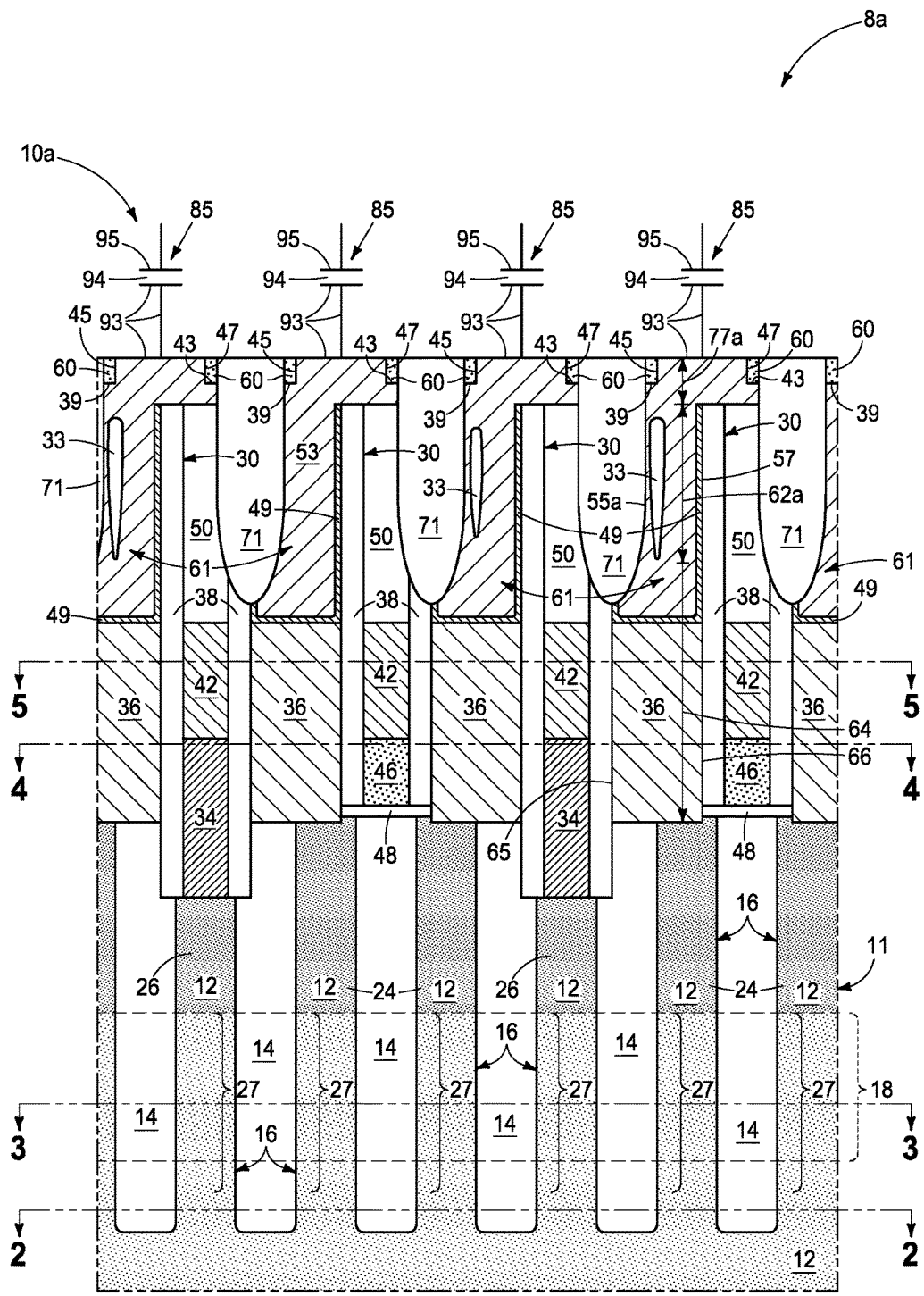
FIG. 27 is a view of the FIG. 26 substrate at a processing step subsequent to that shown by FIG. 26.

Referring to FIG. 26, etching has been conducted completely through at least some of covering material 60 that is directly above individual upper surfaces 43 to conductive material 61 directly there-below and further etching has been conducted into such conductive material thereby forming a stair-step 39 that is directly below and directly against covering material 60 that is directly there-above. In one embodiment, at least some of stair-step 39 remains in finished integrated circuitry construction comprising the array of capacitors (FIG. 27). Regardless, covering material 60 may or may not be completely removed.

Any other attribute(s) or aspect(s) as shown and/or described herein with respect to other embodiments may be used.

Embodiments of the invention encompass a method of forming an array (e.g., 10) of capacitors (e.g., 85) independent of whether forming DRAM or other memory circuitry. Such a method comprises providing a substrate (e.g., 8) comprising an array of horizontally-elongated and laterally-spaced conductive-line structures (e.g., 30). Conductive vias (e.g., 36) are laterally between and spaced longitudinally along immediately-laterally-adjacent of the conductive-line structures. Conductive material (e.g., 61) is formed directly above the conductive-line structures and directly above and directly against the conductive vias. The conductive material has an upper surface (e.g., 43) and a first sidewall (e.g., 45) that are directly above individual of the conductive vias in a vertical cross-section (e.g., that shown by FIG. 15 or FIG. 24). The conductive material has a second sidewall (e.g., 47) directly above an immediately-laterally-adjacent of the conductive-line structures in the vertical cross-section.

Covering material (e.g., 60) is formed directly above individual of the upper surfaces and against individual of the first sidewalls directly above the individual conductive vias. The covering material comprises a composition different from that of at least some of the conductive material. Etching is conducted completely through at least some of the covering material that is directly above the individual upper surfaces to conductive material 61 directly there-below and further etching is conducted into such conductive material below uppermost surfaces (e.g., 63) of the conductive-line structures. The covering material that is against the individual first sidewalls masks the individual first sidewalls from being etched during such etchings.

A plurality of capacitors (e.g., 85) individually comprise a lower conductive electrode (e.g., 93), an upper conductive electrode (e.g., 95), and a capacitor insulator (e.g., 94) there-between. Individual of the lower conductive electrodes comprise the conductive material directly above said immediately-laterally-adjacent individual conductive-line structures.

Any other attribute(s) or aspect(s) as shown and/or described herein with respect to other embodiments may be used.

Embodiments of the invention encompass a method of forming elevationally-elongated conductive structures (e.g., a combination of materials 36 and 61, and in one embodiment which are vertical or within 10° of vertical) of integrated circuitry regardless of whether comprising memory or other circuitry. Such a method comprises providing a substrate (e.g., 8) comprising a plurality of spaced elevationally-extending conductive vias (e.g., 36). Conductive material (e.g., 61) is formed directly above and directly against the conductive vias. The conductive material has an upper surface (e.g., 43) and a first sidewall (e.g., 45) that are directly above individual of the conductive vias in a vertical cross-section. The conductive material has a second sidewall (e.g., 47) that is not directly above the individual conductive vias.

Covering material (e.g., 60) is formed directly above individual of the upper surfaces and against individual of the first sidewalls directly above the individual conductive vias. The covering material comprises a composition different from that of at least some of the conductive material. Etching is conducted completely through at least some of the covering material that is directly above the individual upper surfaces to the conductive material directly there-below and further etching is conducted into the conductive material directly there-below. The covering material that is against the individual first sidewalls masks the individual first sidewalls from being etched during said etchings.

Any other attribute(s) or aspect(s) as shown and/or described herein with respect to other embodiments may be used.

Embodiments of the invention encompass an elevationally-elongated conductive structure of integrated circuitry independent of method of manufacture, for example as shown in FIG. 22. Nevertheless, such a structure may have any of the attributes described above with respect to method embodiments. Such a structure (e.g., combination of 36, 61, and 60) comprises conductive material (e.g., 61) electrically coupled to (in one embodiment directly electrically coupled to) and extending upwardly relative to a lower node (e.g., 24). The conductive material comprises an uppermost portion (e.g., 77), a lower portion (e.g., 62) directly below the uppermost portion, and a lowest portion (e.g., 64) directly below the lower portion. The uppermost portion, the lower portion, and the lowest portion respectively have opposing first and second sidewalls (e.g., 45/47, 55/57, 65/66, respectively; i.e., different laterally outer surfaces of material 61 and/or vias 36 in the respective portions) in a same vertical cross-section (e.g., the cross-section that is FIG. 22).

The uppermost-portion first sidewall (e.g., 45) is laterally between the lowest-portion first and second sidewalls (e.g., 65 and 66, respectively). The uppermost-portion second sidewall (e.g., 47) is laterally-outward beyond the lowest-portion first and second sidewalls. The lower-portion first sidewall (e.g., 55) is laterally-between the lowest-portion first and second sidewalls (e.g., 65 and 66, respectively). The lower-portion second sidewall (e.g., 57) is laterally-between the uppermost-portion first and second sidewalls (e.g., 45 and 47, respectively). The lower-portion first sidewall (e.g., 55) is continuous with the uppermost-portion first sidewall (e.g., 45). The lowest-portion first sidewall (e.g., 65) is laterally-outward beyond the uppermost-portion first sidewall (e.g., 45) and the lower-portion first sidewall (e.g., 55). The lowest-portion second sidewall (e.g., 66) is laterally-between the uppermost-portion first and second sidewalls (e.g., 45 and 47, respectively).

Covering material (e.g., 60) is laterally over all of the uppermost-portion first and second sidewalls (e.g., 45 and 47, respectively). The covering material is laterally over an uppermost part of the lower-portion first sidewall (e.g., 55). The covering material is not laterally over a lowermost part of the lower-portion first sidewall (e.g., 55).

Embodiments of the invention encompass an elevationally-elongated conductive structure of integrated circuitry independent of method of manufacture, for example as shown in FIG. 27. Nevertheless, such a structure may have any of the attributes described above with respect to method embodiments. Such a structure (e.g., combination of 36, 61, and 60) comprises conductive material (e.g., 61) electrically coupled to (in one embodiment directly electrically coupled to) and extending upwardly relative to a lower node (e.g., 24). The conductive material comprises an uppermost portion (e.g., 77), a lower portion (e.g., 62) directly below the uppermost portion, and a lowest portion (e.g., 64) directly below the lower portion. The uppermost portion, the lower portion, and the lowest portion respectively have opposing first and second sidewalls (e.g., 45/47, 55/57, 65/66, respectively; i.e., different laterally outer surfaces of material 61 and/or vias 36 in the respective portions) in a same vertical cross-section (e.g., the cross-section that is FIG. 27).

The uppermost-portion first sidewall (e.g., 45) is laterally between the lowest-portion first and second sidewalls (e.g., 65 and 66, respectively). The uppermost-portion second sidewall (e.g., 47) is laterally-outward beyond the lowest-portion first and second sidewalls. The lower-portion first sidewall (e.g., 55) is laterally-between the lowest-portion first and second sidewalls (e.g., 65 and 66, respectively). The lower-portion second sidewall (e.g., 57) is laterally-between the uppermost-portion first and second sidewalls (e.g., 45 and 47, respectively). The lower-portion first sidewall (e.g., 55) is discontinuous with the uppermost-portion first sidewall (e.g., 45). A stair-step (e.g., 39) is laterally between the lower-portion first sidewall (e.g., 55) and the uppermost-portion first sidewall (e.g., 45). The lowest-portion first sidewall (e.g., 65) is laterally-outward beyond the uppermost-portion first sidewall (e.g., 45) and the lower-portion first sidewall (e.g., 55). The lowest-portion second sidewall (e.g., 66) is laterally-between the uppermost-portion first and second sidewalls (e.g., 45 and 47, respectively).

Covering material (e.g., 60) is laterally over all of the uppermost-portion first and second sidewalls (e.g., 45 and 47, respectively). The covering material is directly above, and in one embodiment directly against, the step (e.g., 39).

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, "selective" as to etch, etching, removing, removal, forming, and/or formation is such an act of one stated material relative to another stated material(s) so acted upon at a rate of at least 1.5:1 by volume.

CONCLUSION

In some embodiments, a method of forming an array of capacitors comprises providing a substrate comprising an array of horizontally-elongated and laterally-spaced conductive-line structures. The conductive vias are laterally between and spaced longitudinally along immediately-laterally-adjacent of the conductive-line structures. Conductive material is formed directly above the conductive-line structures and directly above and directly against the conductive vias. The conductive material has an upper surface and a first sidewall that are directly above individual of the conductive vias in a vertical cross-section. The conductive material has a second sidewall directly above an immediately-laterally-adjacent of the conductive-line structures in the vertical cross-section. Covering material is formed directly above individual of the upper surfaces and against individual of the first sidewalls directly above the individual conductive vias. The covering material comprises a composition different from that of at least some of the conductive material. Etching is conducted completely through at least some of the covering material that is directly above the individual upper surfaces to the conductive material directly there-below and etching is conducted into said conductive material below uppermost surfaces of the conductive-line structures. The covering material that is against the individual first sidewalls masks the individual first sidewalls from being etched during said etchings. A plurality of capacitors is formed that individually comprise a lower conductive electrode, an upper conductive electrode, and a capacitor insulator therebetween. Individual of the lower conductive electrodes comprise the conductive material directly above said immediately-laterally-adjacent individual conductive-line structures.

In some embodiments, a method of forming DRAM circuitry comprises providing a substrate comprising pairs of recessed access devices. The recessed access devices individually comprise a conductive gate in a trench in semiconductive material. A gate insulator is along sidewalls and a base of the trench between the conductive gate and the semiconductive material. A pair of source/drain regions is in upper portions of the semiconductive material on opposing sides of the trench. A channel region is in the semiconductive material below the pair of source/drain regions along the trench sidewalls and around the trench base. One of the source/drain regions of the pair of source/drain regions in individual of the pairs of recessed access devices is laterally between the conductive gates in and is shared by the individual pairs of recessed access devices. The others of the source/drain regions of the pair of source/drain regions is not shared in the individual pairs of recessed access devices. Digitline structures are formed that are individually directly electrically coupled to the one shared source/drain region of multiple of the individual pairs of recessed access devices. Conductive vias are laterally between and spaced longitudinally along the digitline structures. Individual of the conductive vias are directly electrically coupled to one of the other source/drain regions in the individual pairs of recessed access devices. Conductive material is formed directly above the digitline structures and directly above and directly against the conductive vias. The conductive material has an upper surface and a first sidewall that are directly above individual of the conductive vias in a vertical cross-section. The conductive material has a second sidewall directly above an immediately-laterally-adjacent of the digitline structures in the vertical cross-section. Covering material is formed directly above individual of the upper surfaces and directly against individual of the first sidewalls directly above the individual conductive vias. The covering material comprises a composition different from that of the conductive material of the first sidewall. Etching is conducted completely through at least some of the covering material that is directly above the individual upper surfaces to the conductive material directly there-below and etching is conducted into said conductive material below uppermost surfaces of the digitline structures. The covering material that is directly against the individual first sidewalls masks the individual first sidewalls from being etched during said etchings. A plurality of capacitors is formed that individually comprise a lower conductive electrode, an upper conductive electrode, and a capacitor insulator there-between. Individual of the lower conductive electrodes comprise the conductive material directly above said immediately-laterally-adjacent individual digitline structures.

In some embodiments, a method of forming elevationally-elongated conductive structures of integrated circuitry comprises providing a substrate comprising a plurality of spaced elevationally-extending conductive vias. Conductive material is formed directly above and directly against the conductive vias. The conductive material has an upper surface and a first sidewall that are directly above individual of the conductive vias in a vertical cross-section. The conductive material has a second sidewall that is not directly above the individual conductive vias. Covering material is formed directly above individual of the upper surfaces and against individual of the first sidewalls directly above the individual conductive vias. The covering material comprises a composition different from that of at least some of the conductive material. Etching is conducted completely through at least some of the covering material that is directly above the individual upper surfaces to the conductive material directly there-below and etching is conducted into said conductive material. The covering material that is against the individual first sidewalls masks the individual first sidewalls from being etched during said etchings.

In some embodiments, an elevationally-elongated conductive structure of integrated circuitry comprises conductive material electrically coupled to and extending upwardly relative to a lower node. The conductive material comprises an uppermost portion, a lower portion directly below the uppermost portion, and a lowest portion directly below the lower portion. The uppermost portion, the lower portion, and the lowest portion respectively have opposing first and second sidewalls in a same vertical cross-section. The uppermost-portion first sidewall is laterally-between the lowest-portion first and second sidewalls. The uppermost-portion second sidewall is laterally-outward beyond the lowest-portion first and second sidewalls. The lower-portion first sidewall is laterally-between the lowest-portion first and second sidewalls. The lower-portion second sidewall is laterally-between the uppermost-portion first and second sidewalls. The lower-portion first sidewall is continuous with the uppermost-portion first sidewall. The lowest-portion first sidewall is laterally-outward beyond the uppermost-portion first sidewall and the lower-portion first sidewall. The lowest-portion second sidewall is laterally-between the uppermost-portion first and second sidewalls. Covering material is laterally over all of the uppermost-portion first and second sidewalls. The covering material is laterally over an uppermost part of the lower-portion first sidewall. The covering material is laterally over a lowermost part of the lower-portion first sidewall.

In some embodiments, an elevationally-elongated conductive structure of integrated circuitry comprises conductive material electrically coupled to and extending upwardly relative to a lower node. The conductive material comprises an uppermost portion, a lower portion directly below the uppermost portion, and a lowest portion directly below the lower portion. The uppermost portion, the lower portion, and the lowest portion respectively have opposing first and second sidewalls in a same vertical cross-section. The uppermost-portion first sidewall is laterally-between the lowest-portion first and second sidewalls. The uppermost-portion second sidewall is laterally-outward beyond the lowest-portion first and second sidewalls. The lower-portion first sidewall is laterally-between the lowest-portion first and second sidewalls. The lower-portion second sidewall is laterally-between the uppermost-portion first and second sidewalls. The lower-portion first sidewall is discontinuous with the uppermost-portion first sidewall. A stair-step is laterally between the lower-portion first sidewall and the uppermost-portion first sidewall. The lowest-portion first sidewall is laterally-outward beyond the uppermost-portion first sidewall and the lower-portion first sidewall. The lowest-portion second sidewall is laterally-between the uppermost-portion first and second sidewalls. Covering material is laterally over all of the uppermost-portion first and second sidewalls and directly above the step.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of capacitors, comprising:
   providing a substrate comprising an array of horizontally-elongated and laterally-spaced conductive-line structures, conductive vias being laterally between and spaced longitudinally along immediately-laterally-adjacent of the conductive-line structures;
   forming conductive material directly above the conductive-line structures and directly above and directly against the conductive vias, the conductive material having an upper surface and a first sidewall that are directly above individual of the conductive vias in a vertical cross-section, the conductive material having a second sidewall directly above an immediately-laterally-adjacent of the conductive-line structures in the vertical cross-section;
   forming covering material directly above individual of the upper surfaces and against individual of the first sidewalls directly above the individual conductive vias, the covering material comprising a composition different from that of at least some of the conductive material;
   etching completely through at least some of the covering material that is directly above the individual upper surfaces to the conductive material directly there-below and etching into said conductive material below uppermost surfaces of the conductive-line structures, the covering material that is against the individual first sidewalls masking the individual first sidewalls from being etched during said etchings; and forming a plurality of capacitors individually comprising a lower conductive electrode, an upper conductive electrode, and a capacitor insulator there-between; individual of the lower conductive electrodes comprising the conductive material directly above said immediately-laterally-adjacent individual conductive-line structures.

2. The method of claim 1 wherein the covering material is formed directly against the conductive material of the first sidewall.

3. The method of claim 1 wherein the covering material comprises a composition different from that of the conductive material of the first sidewall.

4. The method of claim 1 wherein forming the conductive material comprises:

depositing the conductive material directly above the conductive-line structures and directly above and directly against the conductive vias; and etching into the deposited conductive material to form the upper surface, the first sidewall, and the second sidewall; the etching of that portion of the deposited conductive material that is directly above the individual conductive vias removing at least 50% of the maximum thickness as measured directly above the conductive-line structures.

5. The method of claim 4 wherein the etching of that portion of the deposited conductive material removes less than all of said maximum thickness relative to the deposited conductive material that is directly above the individual conductive vias.

6. The method of claim 4 wherein the etching of that portion of the deposited conductive material that is directly above the individual conductive vias removes at least 50% of said maximum thickness.

7. The method of claim 4 wherein the etching of that portion of the deposited conductive material that is directly above the individual conductive vias removes more than all of said maximum thickness.

8. The method of claim 1 wherein the forming of the conductive material comprises:

depositing the conductive material directly above the conductive-line structures and directly above and directly against the conductive vias;

etching of that portion of the deposited conductive material that is directly above the individual conductive vias to remove no more than 85% of the maximum thickness as measured directly above the conductive-line structures; and the etching completely through at least some of the covering material that is directly above the individual upper surfaces to the conductive material directly therebelow and the etching into said conductive material below uppermost surfaces of the conductive-line structures forming a stair-step that is directly below and directly against the covering material that is directly there-above.

9. The method of claim 8 wherein at least some of the stair-step remains in a finished integrated circuitry construction comprising the array of capacitors.

10. The method of claim 1 wherein the etching of that portion of the conductive material that is directly above the individual conductive vias removes at least 20% of the maximum thickness as measured directly above the conductive-line structures.

11. The method of claim 1 comprising forming the conductive material to comprise a vertically-elongated void space therein directly above at least some of the individual conductive vias.

12. The method of claim 11 comprising forming the conductive material to comprise the vertically-elongated void space therein directly above less than all of the individual conductive vias.

13. The method of claim 11 wherein, forming the conductive material comprises:

depositing the conductive material directly above the conductive-line structures and directly above and directly against the conductive vias; and etching into the deposited conductive material to form the upper surface, the first sidewall, and the second sidewall; the etching of that portion of the deposited conductive material upwardly exposing at least some of the void spaces; and the covering material is formed to within said at least some void spaces.

14. The method of claim 13 wherein the etching into the deposited conductive material upwardly exposes less than all of the void spaces.

15. The method of claim 11 wherein, forming the conductive material comprises:

depositing the conductive material directly above the conductive-line structures and directly above and directly against the conductive vias; and etching into the deposited conductive material to form the upper surface, the first sidewall, and the second sidewall; the etching of that portion of the deposited conductive material not upwardly exposing any of the void spaces such that none of the covering material is formed to within any of said void spaces.

16. The method of claim 1 wherein the covering material is insulative.

17. The method of claim 1 wherein the covering material is not insulative.

18. The method of claim 1 comprising removing all remaining of the covering material prior to forming the capacitor insulator.

19. The method of claim 1 wherein at least some of the covering material against the first sidewalls remains in a finished integrated circuitry construction comprising the array of capacitors.

20. The method of claim 1 comprising forming the covering material against the second sidewalls while forming the covering material against the first sidewalls.

21. The method of claim 1 comprising forming the covering material to have a maximum thickness no greater than 100 Angstroms.

22. The method of claim 1 comprising etching into some, and only some, material of the conductive-line structures while etching into the conductive material.

23. A method of forming DRAM circuitry comprising:

providing a substrate comprising pairs of recessed access devices, the recessed access devices individually comprising:

a conductive gate in a trench in semiconductive material;

a gate insulator along sidewalls and a base of the trench between the conductive gate and the semiconductive material;

a pair of source/drain regions in upper portions of the semiconductive material on opposing sides of the trench;

a channel region in the semiconductive material below the pair of source/drain regions along the trench sidewalls and around the trench base; and one of the source/drain regions of the pair of source/drain regions in individual of the pairs of recessed access devices being laterally between the conductive gates in and being shared by the individual pairs of recessed access devices, the others of the source/drain regions of the pair of source/drain regions not being shared in the individual pairs of recessed access devices;

forming digitline structures that are individually directly electrically coupled to the one shared source/drain region of multiple of the individual pairs of recessed access devices;

forming conductive vias laterally between and spaced longitudinally along the digitline structures, individual of the conductive vias being directly electrically coupled to one of the other source/drain regions in the individual pairs of recessed access devices;

forming conductive material directly above the digitline structures and directly above and directly against the conductive vias, the conductive material having an upper surface and a first sidewall that are directly above individual of the conductive vias in a vertical cross-section, the conductive material having a second sidewall directly above an immediately-laterally-adjacent of the digitline structures in the vertical cross-section;

forming covering material directly above individual of the upper surfaces and directly against individual of the first sidewalls directly above the individual conductive vias, the covering material comprising a composition different from that of the conductive material of the first sidewall;

etching completely through at least some of the covering material that is directly above the individual upper surfaces to the conductive material directly there-below and etching into said conductive material below uppermost surfaces of the digitline structures, the covering material that is directly against the individual first sidewalls masking the individual first sidewalls from being etched during said etchings; and forming a plurality of capacitors individually comprising a lower conductive electrode, an upper conductive electrode, and a capacitor insulator there-between; individual of the lower conductive electrodes comprising the conductive material directly above said immediately-laterally-adjacent individual digitline structures.

24. A method of forming elevationally-elongated conductive structures of integrated circuitry, comprising:

providing a substrate comprising a plurality of spaced elevationally-extending conductive vias;

forming conductive material directly above and directly against the conductive vias, the conductive material having an upper surface and a first sidewall that are directly above individual of the conductive vias in a vertical cross-section, the conductive material having a second sidewall that is not directly above the individual conductive vias;

forming covering material directly above individual of the upper surfaces and against individual of the first sidewalls directly above the individual conductive vias, the covering material comprising a composition different from that of at least some of the conductive material; and etching completely through at least some of the covering material that is directly above the individual upper surfaces to the conductive material directly there-below and etching into said conductive material, the covering material that is against the individual first sidewalls masking the individual first sidewalls from being etched during said etchings.

* * * * *